(12) United States Patent
Yu et al.

(10) Patent No.: US 8,557,661 B2
(45) Date of Patent: Oct. 15, 2013

(54) METHODS OF MANUFACTURING A SEMICONDUCTOR DEVICE AND A SEMICONDUCTOR MEMORY DEVICE THEREBY

(75) Inventors: Han-Geun Yu, Seoul (KR); Gyung-Jin Min, Seongnam-si (KR); Seong-Soo Lee, Seongnam-si (KR); Suk-Ho Joo, Seoul (KR); Yoo-Chul Kong, Seoul (KR); Dae-Hyun Jang, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 45 days.

(21) Appl. No.: 13/314,627

(22) Filed: Dec. 8, 2011

(65) Prior Publication Data

US 2012/0187471 A1    Jul. 26, 2012

(30) Foreign Application Priority Data

Jan. 20, 2011    (KR) .................. 10-2011-0005728

(51) Int. Cl.
*H01L 29/78*    (2006.01)
*H01L 21/336*    (2006.01)

(52) U.S. Cl.
USPC ........... 438/268; 438/129; 438/257; 438/591; 438/593; 257/324; 257/E29.309; 257/E21.231; 257/208; 257/326

(58) Field of Classification Search
USPC ................ 257/314–326, E27.078, 257/E29.3–E29.309; 438/257–268, 618, 438/591, 593
See application file for complete search history.

(56) References Cited

U.S. PATENT DOCUMENTS 7,539,056 B2    5/2009    Katsumata et al.
2009/0310415 A1   12/2009    Jin et al.

FOREIGN PATENT DOCUMENTS

JP         2009-170661        7/2009

*Primary Examiner* — Mamadou Diallo
(74) *Attorney, Agent, or Firm* — F. Chau & Associates, LLC

(57) ABSTRACT

A method of manufacturing a semiconductor device comprises forming memory cells on a memory cell region, alternately forming a sacrificial layer and an insulating interlayer on a connection region for providing wirings configured to electrically connect the memory cells, forming an etching mask pattern including etching mask pattern elements on a top sacrificial layer, forming blocking sidewalls on either sidewalls of each of the etching mask pattern element, forming a first photoresist pattern selectively exposing a first blocking sidewall furthermost from the memory cell region and covering the other blocking sidewalls, etching the exposed top sacrificial layer and an insulating interlayer to expose a second sacrificial layer, forming a second photoresist pattern by laterally removing the first photoresist pattern to the extent that a second blocking sidewall is exposed, and etching the exposed top and second sacrificial layers and the insulating interlayers to form a staircase shaped side edge portion.

16 Claims, 24 Drawing Sheets

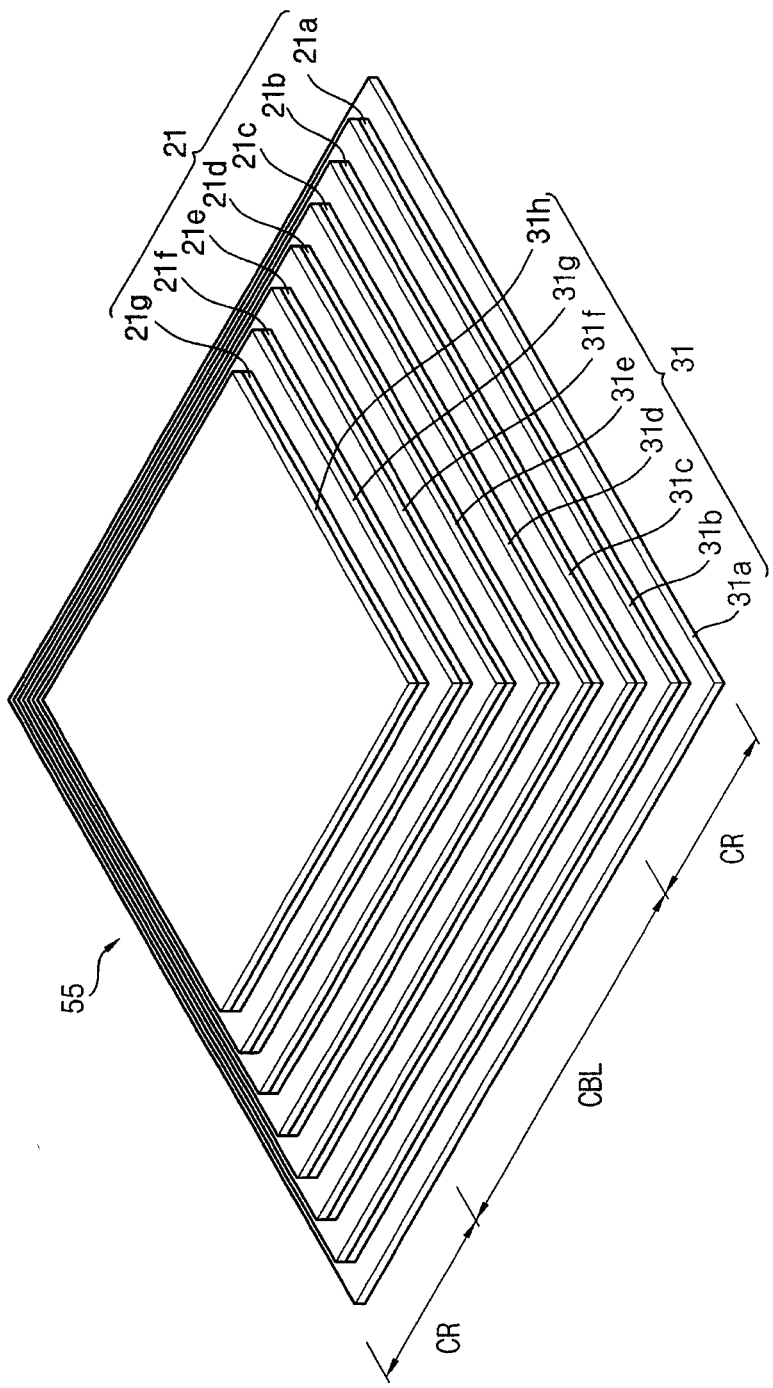

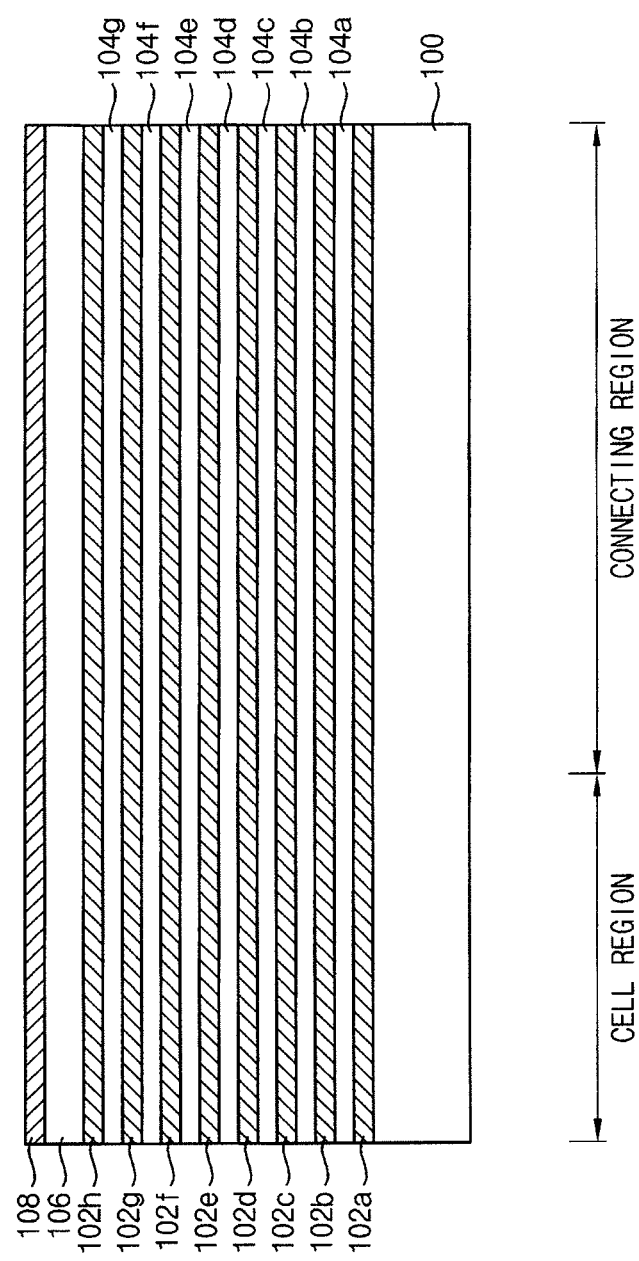

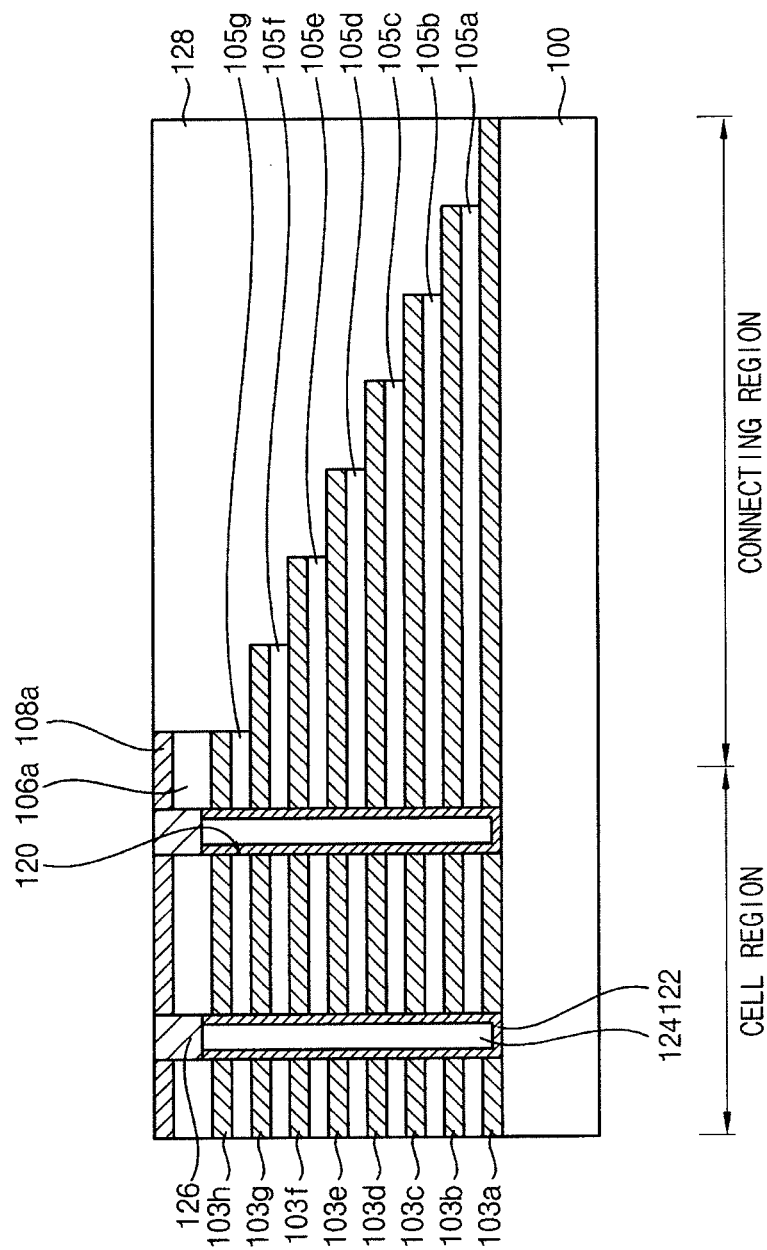

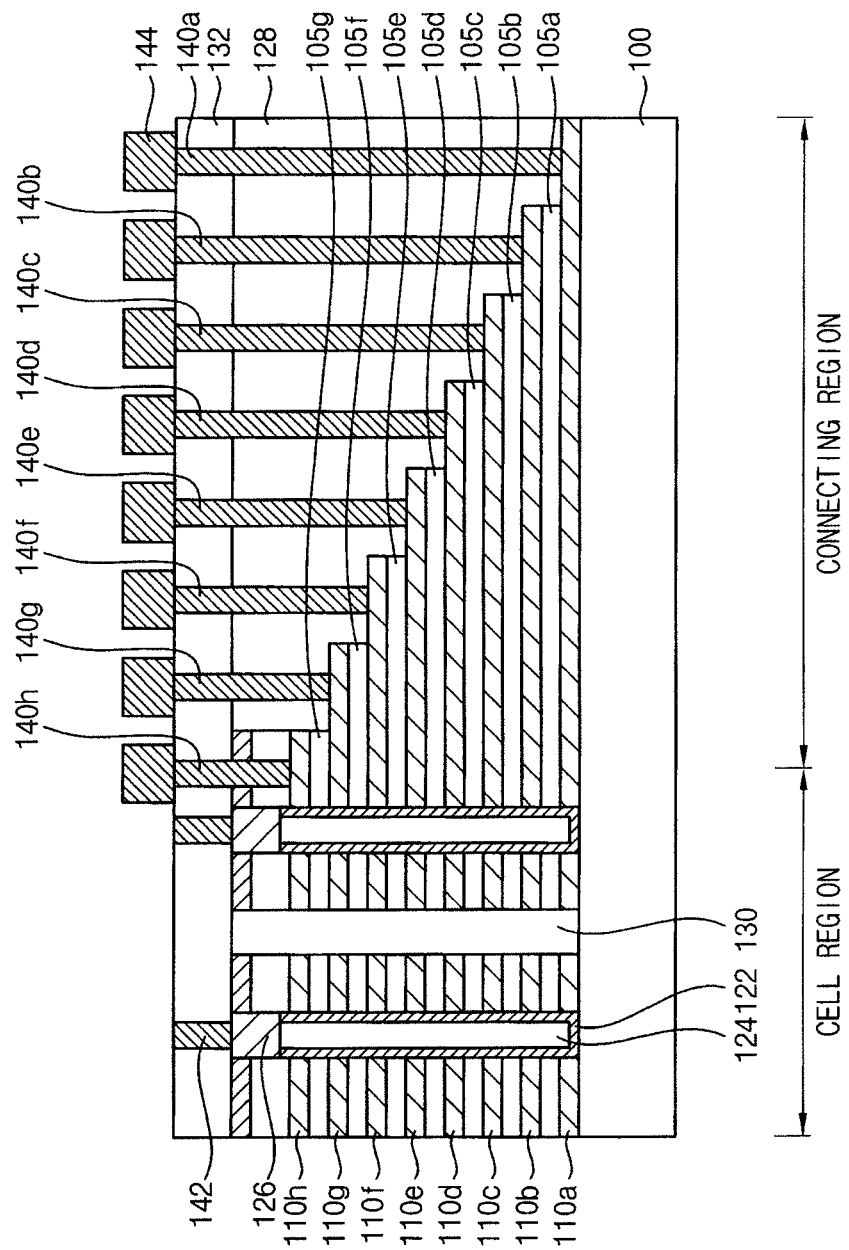

METHODS OF MANUFACTURING A SEMICONDUCTOR DEVICE AND A SEMICONDUCTOR MEMORY DEVICE THEREBY

CROSS-REFERENCE TO RELATED APPLICATIONS

This application claims priority under 35 USC §119 to Korean Patent Application No. 10-2011-0005728, filed on Jan. 20, 2011 in the Korean Intellectual Property Office (KIPO), the contents of which are herein incorporated by reference in their entirety.

TECHNICAL FIELD

The inventive concept described herein relates to methods of manufacturing a semiconductor device and a semiconductor memory device thereby. The inventive concept, in particular, relates to methods of forming a vertically integrated connecting structure by trimming a photoresist layer uniformly, methods of manufacturing a semiconductor device using the same, and a semiconductor memory device thereby.

DESCRIPTION OF THE RELATED ART

Recent demand for highly integrated semiconductor memory devices have called for vertical type semiconductors. Vertical type semiconductor devices have a number of thin film layers that are vertically integrated. Corresponding photolithography process steps to form the vertical layers can be complex, adding to manufacturing costs. Therefore, a need exists for simplified manufacturing processes for reducing the number of photolithography process steps and device structures.

SUMMARY

In an embodiment of the present inventive concept, a method of manufacturing a semiconductor device comprises a step of forming a plurality of memory cells on a memory cell region in a substrate, a step of alternately forming a sacrificial layer and an insulating interlayer on a connection region for providing a plurality of wirings configured to electrically connect the plurality of memory cells, a step of forming an etching mask pattern including a plurality of etching mask pattern elements on a top sacrificial layer, a step of forming blocking sidewalls on either sidewalls of each of the etching mask pattern element, a step of forming a first photoresist pattern selectively exposing a first blocking sidewall furthermost from the memory cell region and covering the other blocking sidewalls, the first photoresist pattern exposing a predetermined portion of the top sacrificial layer, a step of etching the exposed top sacrificial layer and an insulating interlayer below the exposed top sacrificial layer to expose a second sacrificial layer, a step of forming a second photoresist pattern by laterally removing the first photoresist pattern to the extent that a second blocking sidewall is exposed, the second photoresist exposing the predetermined portion of the top sacrificial layer, and a step of etching the exposed top and second sacrificial layers and the insulating interlayers below the respective top and second sacrificial layers using the second photoresist pattern to form a staircase shaped side edge portion.

In a further embodiment of the present inventive concept, the etching mask pattern is formed using amorphous carbon or photoresist. The etching mask pattern elements have a first width, and a gap between adjacent etching mask pattern elements having blocking sidewall has substantially the same width with the first width. Width of the etching mask pattern and the sidewall blocking pattern combined is substantially the same with width of an exposed portion of the sacrificial layer pattern at the side edge portion of the connecting structure. The number of the etching mask pattern elements is greater than the number of sacrificial layers formed by the step of alternately forming a sacrificial layer and an insulation interlayer. The blocking sidewalls are formed using a material having an etching selectivity with respect to the sacrificial layer, the etching mask pattern and the first photoresist pattern, respectively.

In a further embodiment of the present inventive concept, the method of manufacturing a semiconductor device further comprises a step of removing the first exposed blocking sidewall before the step of etching the exposed top sacrificial layer, and a step of removing the second exposed blocking sidewall before the step of etching the exposed top and second sacrificial layers.

In a further embodiment of the present inventive concept, the method of manufacturing a semiconductor device further comprises a step of forming a polymer layer on an upper surface portion of the first photoresist pattern before the step of forming a second photoresist pattern.

In another embodiment of the present inventive concept, a method of manufacturing a semiconductor device comprises a step of forming N sacrificial layers on a memory cell region and a connection region in a substrate, a step of forming N−1 insulation interlayers between the N sacrificial layers, a step of forming an etching mask pattern including N/2 etching mask pattern elements over the connection region, a step of forming sidewall blocking on either sidewalls of the etching mask pattern elements, a step of forming a photoresist layer over the etching mask pattern elements, a step of trimming the photoresist over the connection region to expose a furthermost sidewall blocking from the memory cell region and a predetermined portion of the top sacrificial layer, a step of etching the exposed top sacrificial layer and a top insulating interlayer below the top sacrificial layer to expose a second sacrificial layer below the top insulating interlayer, and a step of repeating the steps of trimming and etching the exposed top sacrificial layer until a bottom sacrificial layer is exposed to form a staircase shaped edge portion in the connection region.

In a further embodiment of the present inventive concept, the sacrificial layer is formed using silicon nitride and the insulating interlayer is formed using silicon oxide. The staircase shaped edge portion includes the bottom sacrificial layer and N−1 steps on the bottom sacrificial layer, each step having uniform width and height.

In a further embodiment of the present inventive concept, a method of manufacturing a semiconductor device further comprises a step of forming an insulating layer after the step of repeating, and a step of forming N contact plugs through the insulating layer over the connection region to expose the sacrificial layers of the staircase shaped edge portion.

In a further embodiment of the present inventive concept, a method of manufacturing a semiconductor device further comprises a step of forming a plurality of channel holes through the sacrificial and insulating layers over the cell formation region, the channel holes exposing the substrate, a step of forming a channel layer in the channel holes, and a step of forming a bit line structure making an electric contact with an upper surface portion of the channel layer pattern. The channel layer includes a tunnel insulating layer, a charge storing layer and a blocking dielectric layer on an inner surface portion of the channel holes.

In a further embodiment of the present inventive concept, a method of manufacturing a semiconductor device further comprises a step of removing the outermost sidewall blocking before the step of etching the exposed top sacrificial layer.

In another embodiment of the present inventive concept, a semiconductor memory device comprises a memory cell region having a plurality of vertical memory cells, a memory connection region having a plurality of contact plugs configured to electrically connect the plurality of memory cells, a plurality of alternate layers of a conductive layer and an insulating layer running from the memory cell region to the memory connection region, the alternate layers being configured to electrically connect the memory cells and contact plugs, and the alternate layers having a staircase shaped edge portion on the memory connection region, and a polish stopping layer aligned with a top conductive layer of the alternate layers.

In a further embodiment of the present inventive concept, the semiconductor device further comprises an insulation layer between the polish stopping layer and the top conductive layer, the insulation layer having larger thickness than each of the insulation interlayers. The staircase shaped edge portion includes a plurality of steps on the bottom conductive layer, each step having uniform width and height. The plurality of steps has top surfaces having the uniform width, the top surfaces being connected to the corresponding contact plugs.

BRIEF DESCRIPTION OF THE DRAWINGS

Exemplary embodiments will be more clearly understood from the following detailed description taken in conjunction with the accompanying drawings.

FIGS. 1 to 8F represent non-limiting, exemplary embodiments as described herein.

FIG. 1 is a plan view illustrating an arrangement of cell regions in a memory device in accordance with exemplary embodiments.

FIG. 3A is a perspective view illustrating a connecting structure in accordance with exemplary embodiments.

FIG. 6 is a plan view for explaining a trimming process of a photoresist pattern.

FIGS. 8A to 8F are cross-sectional views illustrating a method of manufacturing a vertical type semiconductor device in accordance with exemplary embodiments.

DETAILED DESCRIPTION OF THE EMBODIMENTS

Figure 1:
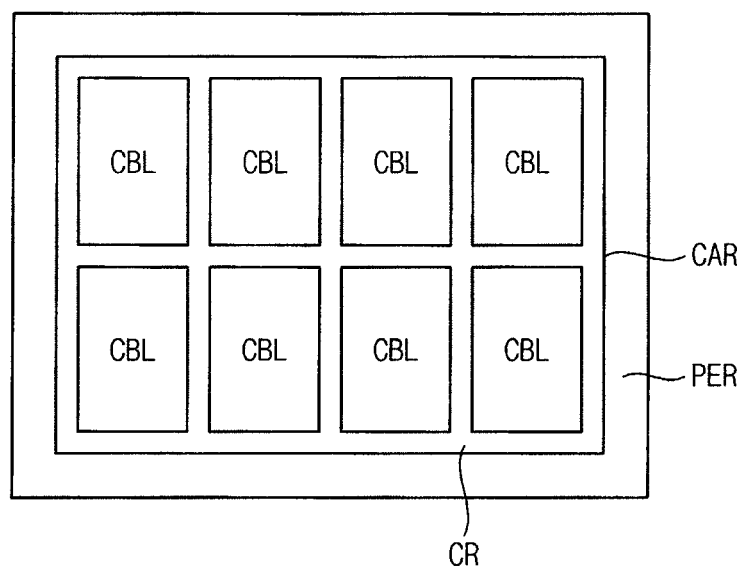

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments on methods of forming a connecting structure and methods of manufacturing a semiconductor device using the same will be explained in detail.

Figure 2A:
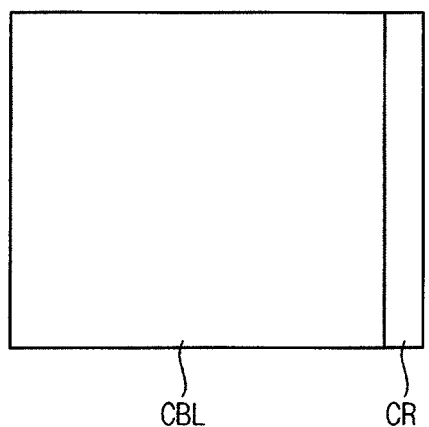
FIGS. 2A to 2C are plan views illustrating an arrangement of cell blocks and connecting regions in the cell region illustrated in FIG. 1.
Figure 2B:
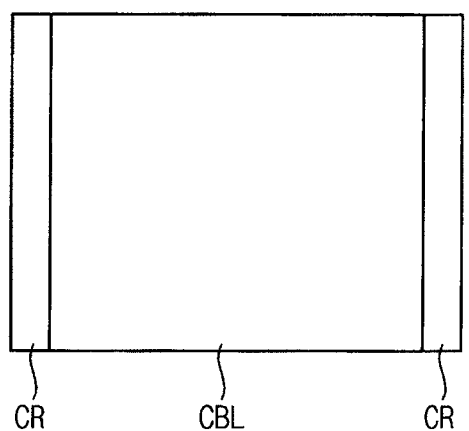
Figure 2C:
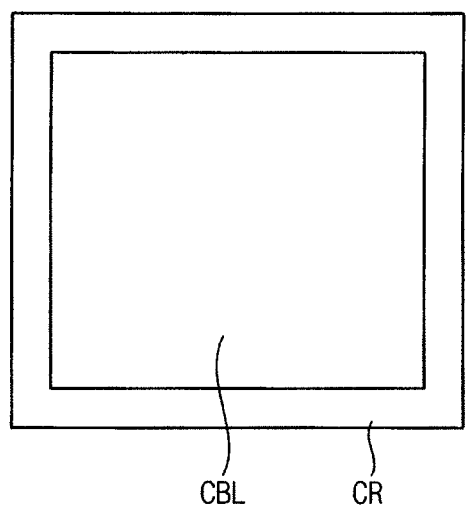

FIG. 1 is a plan view illustrating an arrangement of cell regions in a memory device in accordance with exemplary embodiments. FIGS. 2A to 2C are plan views illustrating an arrangement of cell blocks and connecting regions in the cell region illustrated in FIG. 1.

Referring to FIG. 1, a memory device may include a cell array region CAR including arranged memory cells and a peripheral circuit region PER including circuits for driving the memory cells.

The cell array region CAR may include cell blocks CBL having a plurality memory cells and a connecting region CR. The connecting region CR may be formed with various positional relationship with the cell block CBL. The connecting region CR may include wiring structures connected to conductive lines included in the memory cells.

Referring to FIGS. 2A to 2C, the connecting region CR may have various positional relationship with the cell block CBL. Particularly, FIG. 2A shows that the connecting region CR may be provided at one sidewall of the cell block CBL. FIG. 2B shows that the connecting region CR may be provided at both facing sidewalls of the cell block CBL. FIG. 2C shows that connecting region CR may be provided at all the sidewalls of the cell block CBL.

Memory cells formed in the cell block CBL may be integrated in a vertical direction. Conductive patterns vertically integrated may be extended from the memory cells in a horizontal direction to the connecting region for electrical connections. The extended portions of the conductive patterns may be formed so as to make a connection with their corresponding contact plugs in the connecting region.

To form the wirings having the above-described shape, a connecting structure formed from the cell block CBL to the connecting region CR may be required. The connecting structure may be a mold pattern for forming the vertically integrated wirings. Alternatively, the connecting structure may be a vertically integrated wiring itself.

Figure 3B:
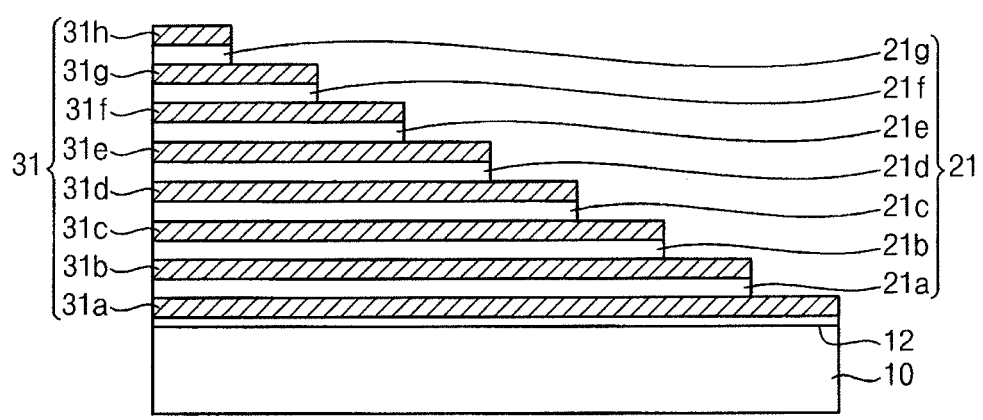
FIG. 3B is a cross-sectional view illustrating a connecting region in the connecting structure illustrated in FIG. 3A.

FIG. 3A is a perspective view illustrating a connecting structure in accordance with exemplary embodiments. FIG. 3B is a cross-sectional view illustrating a connecting region in the connecting structure illustrated in FIG. 3A.

Referring to FIGS. 3A & 3B, a substrate 10 includes a cell block region CBL and a connecting region CR. The cell block region CBL may be provided for forming cells and the connecting region CR may be provided adjacent to the cell block region CBL and include patterns for making an electric connection of the cells.

A connecting structure 55 may extend from the cell block region CBL to the connecting region CR. The connecting region CR may be provided at least one sidewall of the cell block region CBL with a distance. The connecting region CR may be provided adjacent to four sidewalls of the cell block region CBL.

The connecting structure 55 may include an integrated shape of sacrificial layer pattern 31 including first, second, third, fourth, fifth, sixth, seventh and eighth sacrificial layer patterns 31a~31h and insulating interlayer pattern 21 including alternately and repeatedly formed first, second, third, fourth, fifth, sixth and seventh insulating interlayer patterns 21a~21g.

The sacrificial layer pattern 31 and the insulating interlayer pattern 21 may include material having different etching selectivity from each other. Particularly, the sacrificial layer pattern 31 may be formed using silicon nitride or polysilicon. The insulating interlayer pattern 21 may be formed using silicon oxide. When the sacrificial layer pattern 31 is formed using an insulating silicon nitride, the whole connecting structure 55 may be formed using an insulating material. In this case, the connecting structure 55 may be provided as a mold pattern for forming integrated wirings. When the sacrificial layer 31 is formed using polysilicon, the sacrificial layer pattern 31 may have conductive property. Accordingly, the connecting structure 55 may be provided as the wirings.

In the connecting structure 55, the sacrificial layer pattern 31 and the insulating interlayer pattern 21 positioned at the connecting region CR may have a side edge portion of a staircase shape. That is, an underlying sacrificial layer pattern may have a wider area than an upper positioned sacrificial layer pattern.

Since the side edge portion of the sacrificial layer pattern 31 may have the staircase shape, a portion of an upper surface portion of the underlying sacrificial layer pattern may be exposed by a difference between pattern widths of the underlying sacrificial layer pattern and the upper positioned sacrificial layer pattern. The exposed upper surface portion of each sacrificial layer pattern 31 may be used as a pad for making a connection with a contact plug. Width deviation of the exposed upper surface from a preset value may cause the contact plug to form out of a desired position.

In exemplary embodiments, the widths of the exposed upper surface portions of the sacrificial layer patterns 31 at each layer may generate little difference and a process variation from the preset value may be little. Particularly, the width of the exposed upper surface portion may be less than about 100 Å.

Figure 4A:
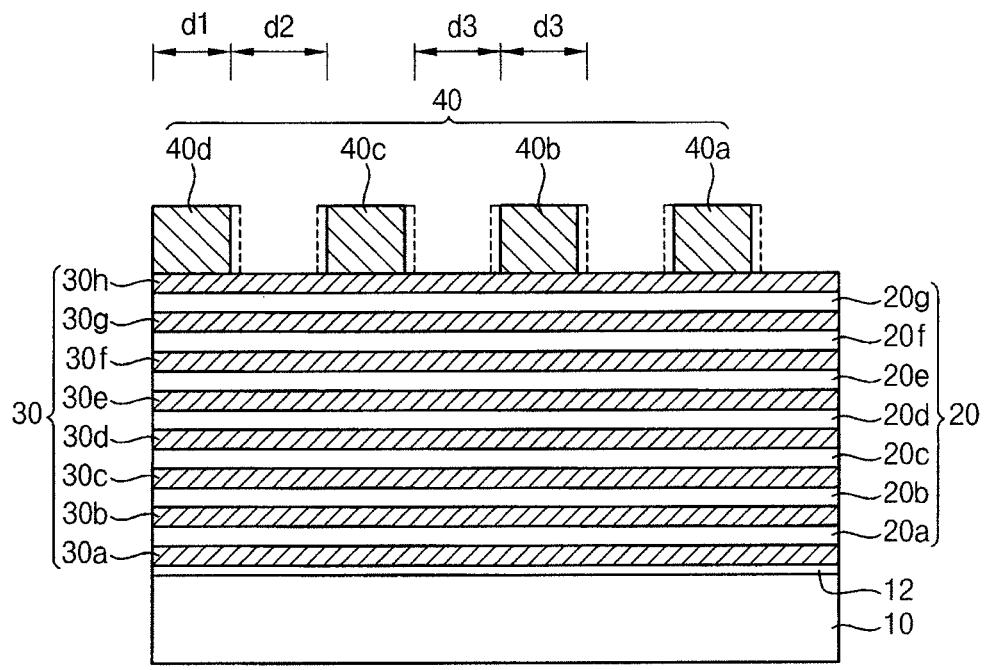
FIGS. 4A to 4O are cross-sectional views for explaining a method of manufacturing the connecting structure illustrated in FIGS. 1 & 2 in accordance with exemplary embodiments.
Figure 4B:
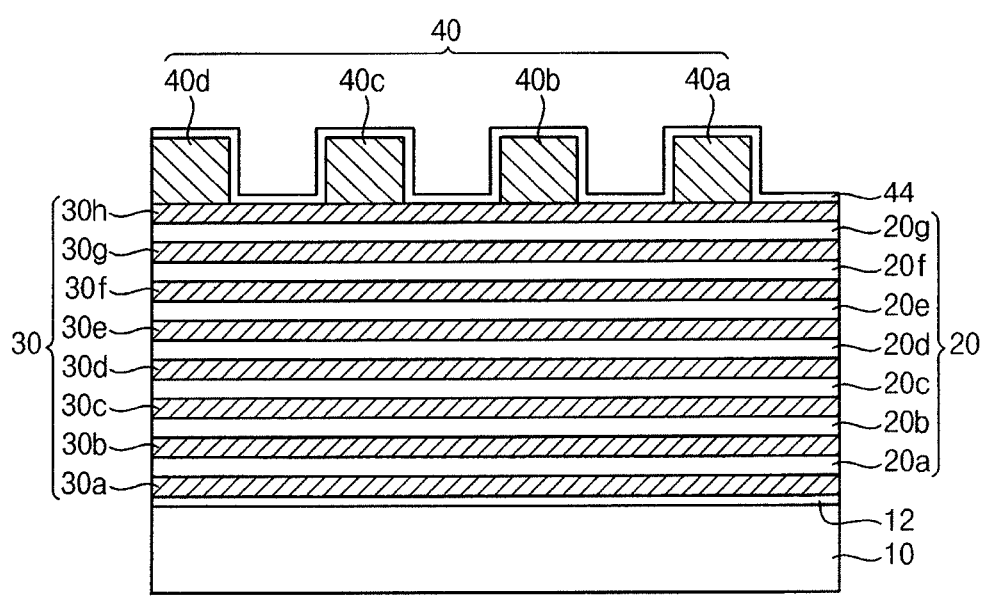
Figure 4C:
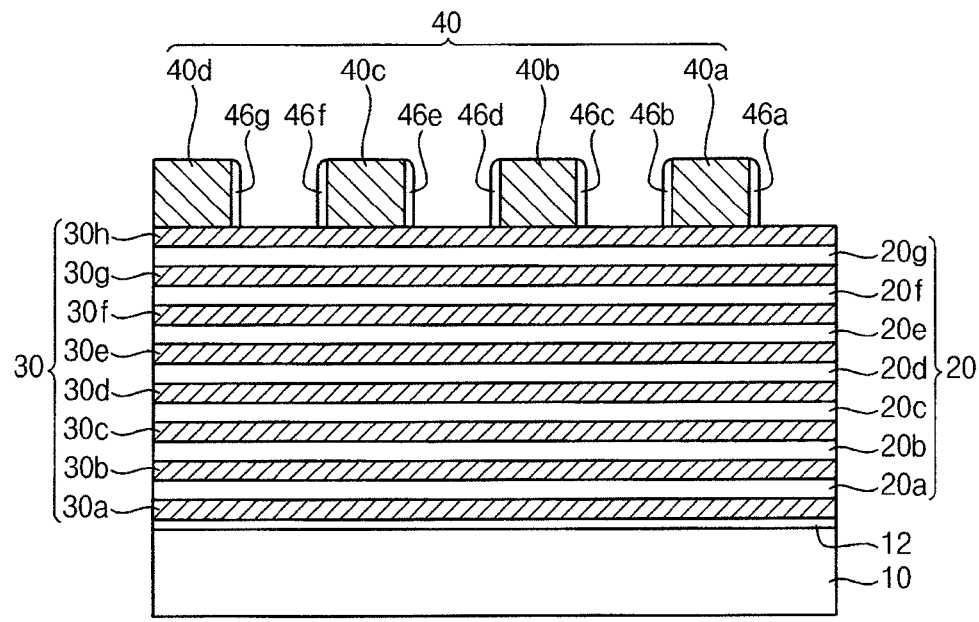
Figure 4D:
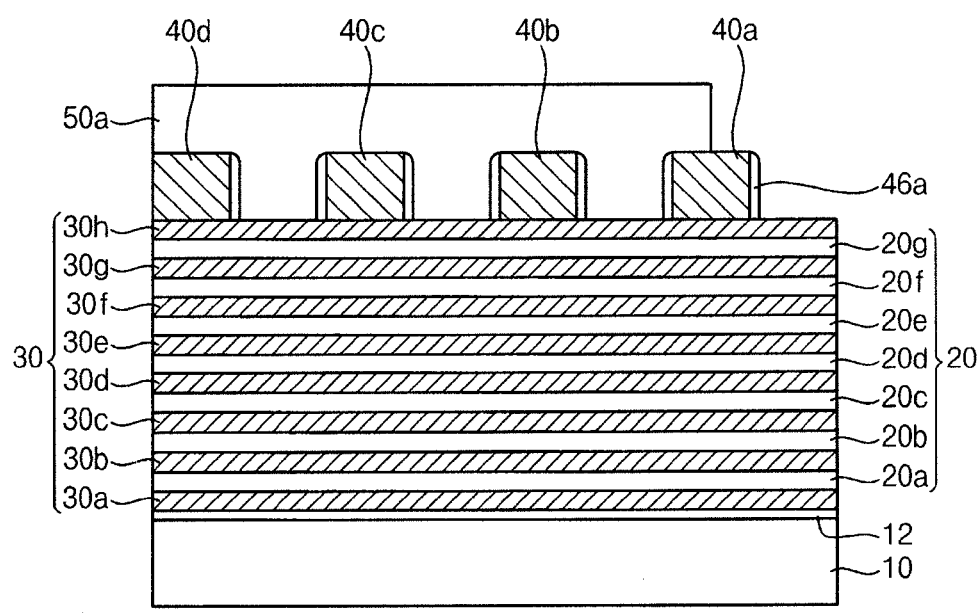
Figure 4E:
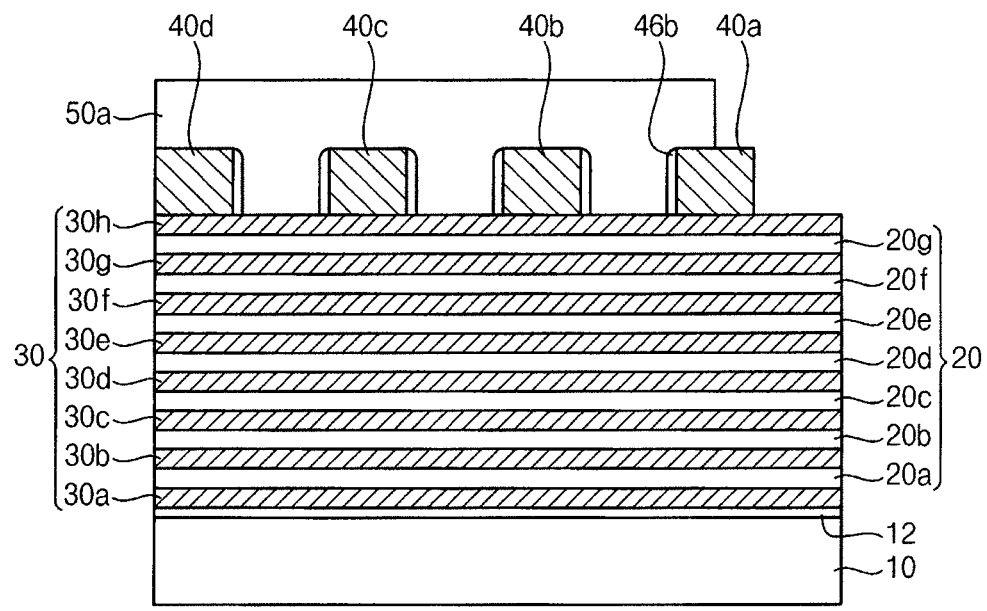
Figure 4F:
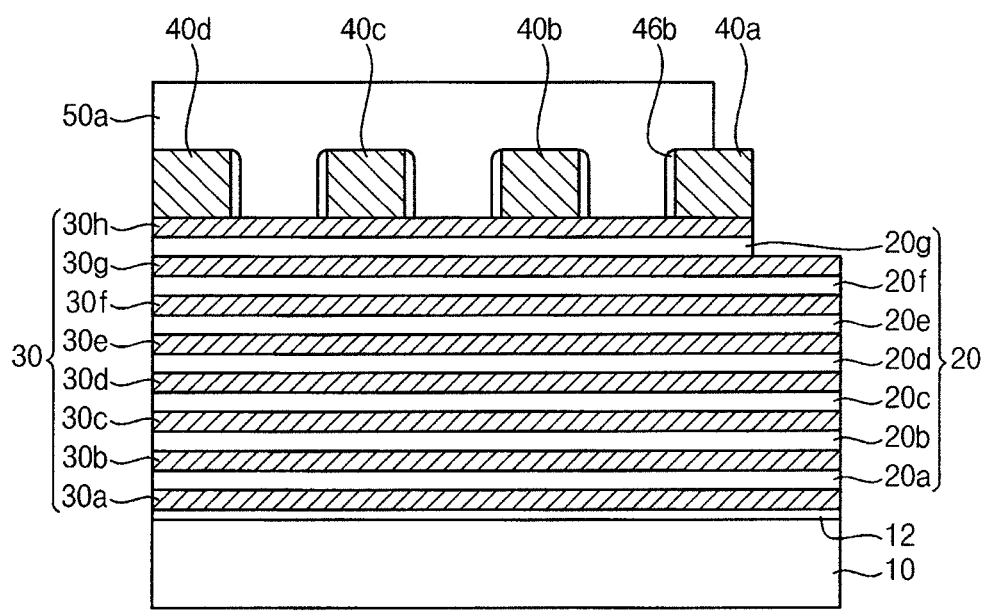
Figure 4G:
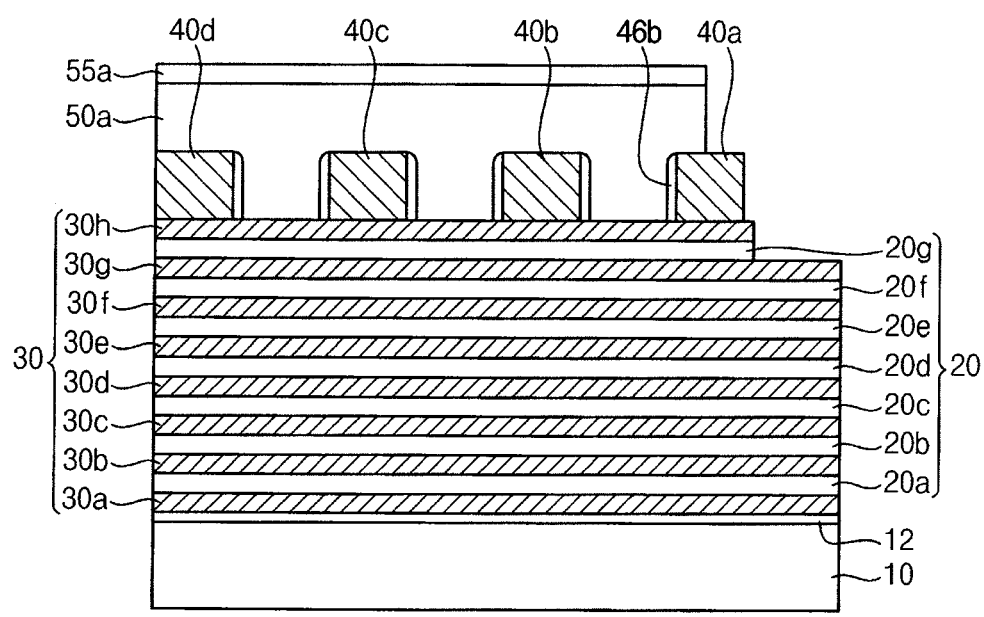
Figure 4H:
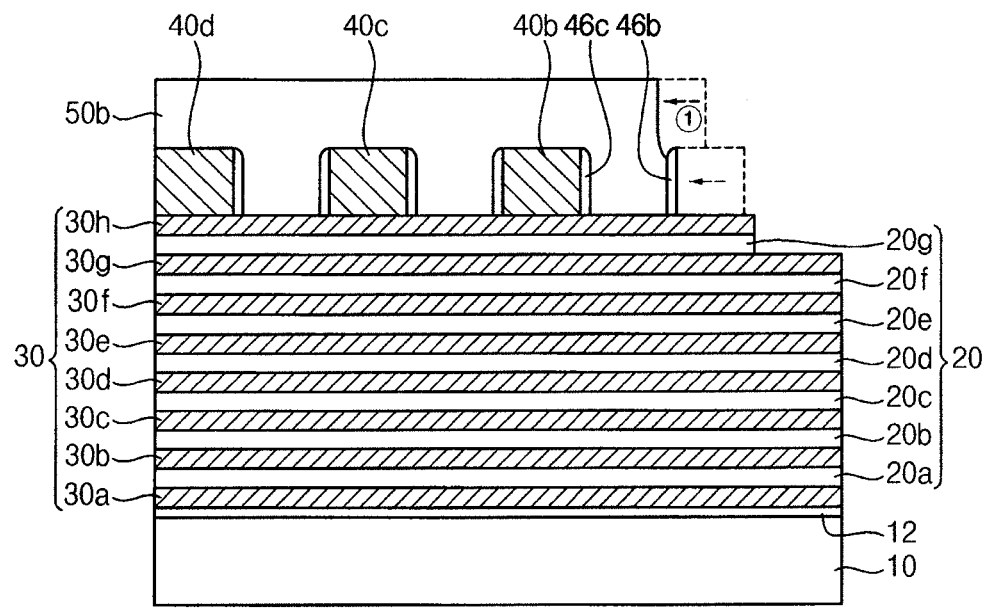
Figure 4I:
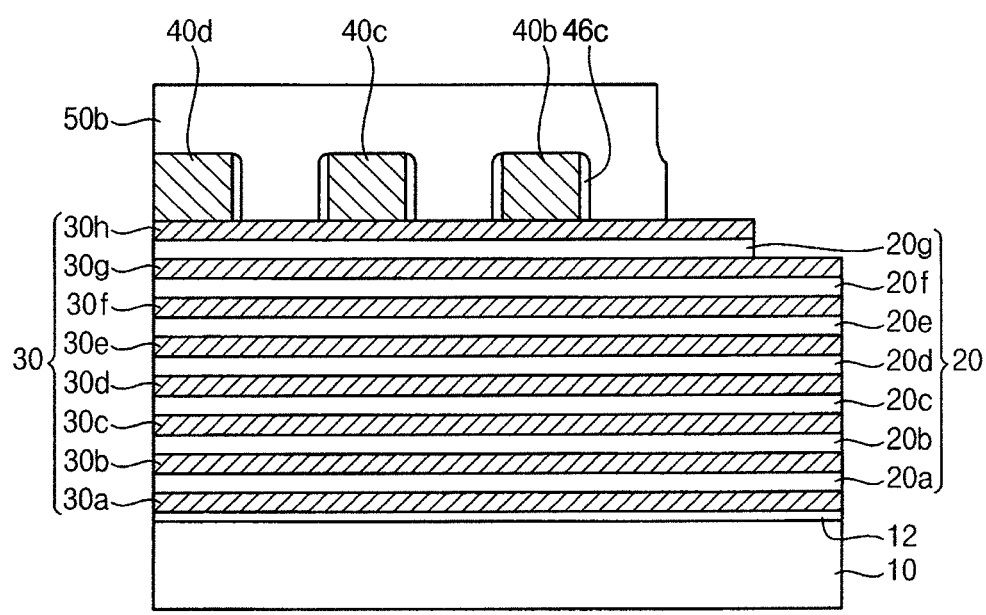
Figure 4J:
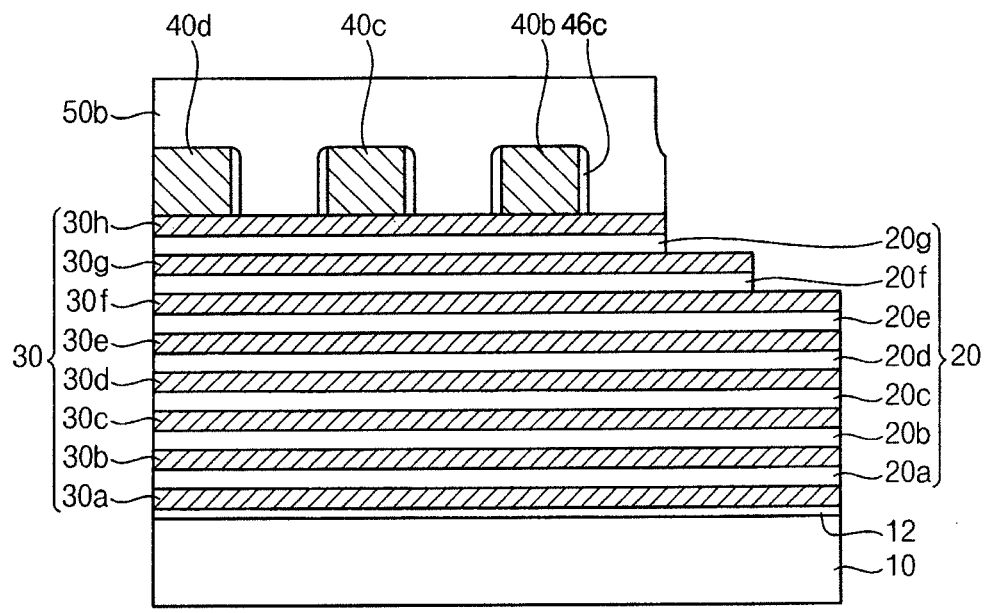
Figure 4K:
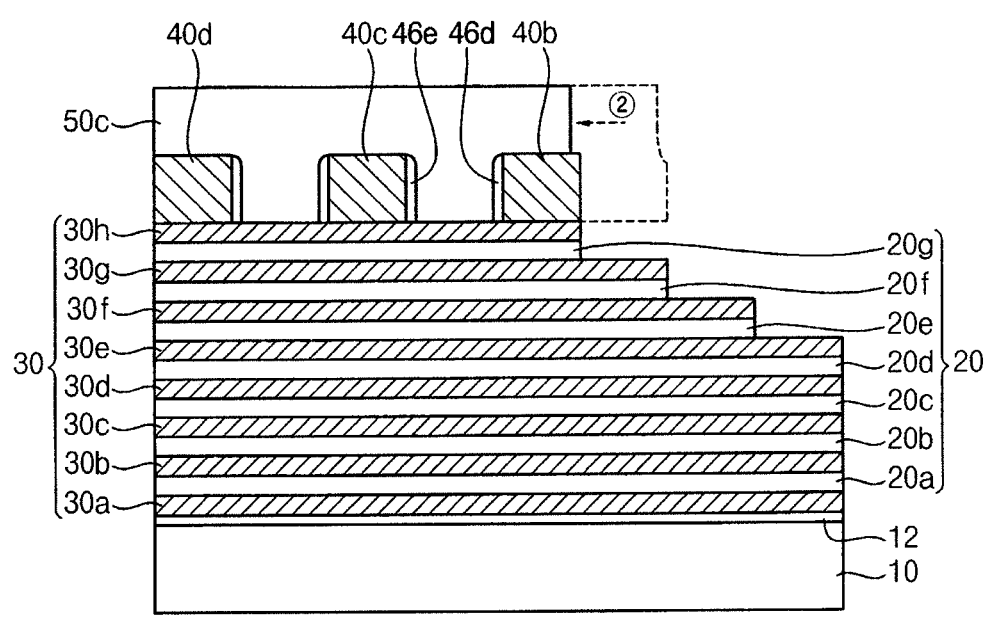
Figure 4L:
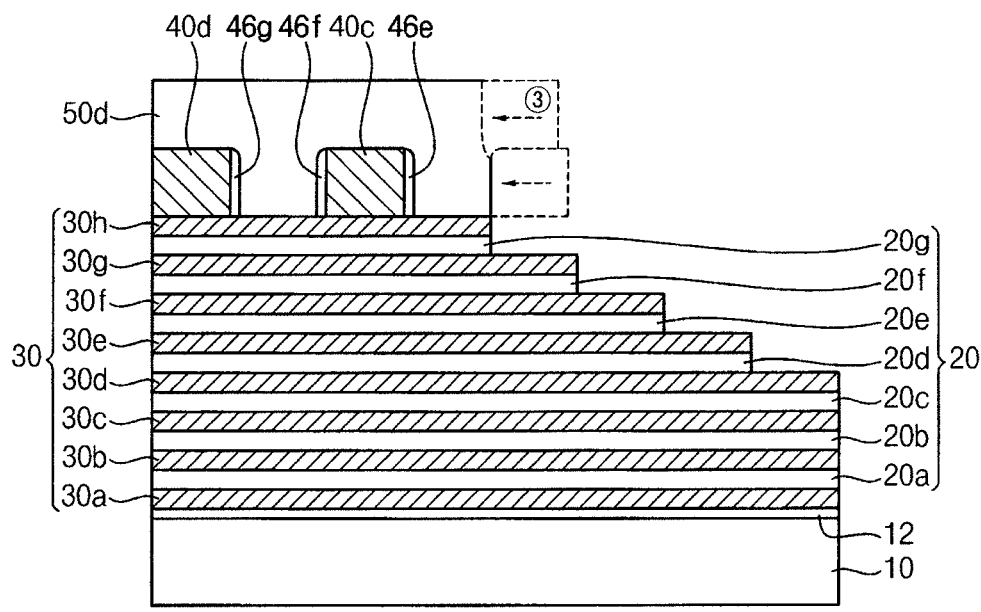
Figure 4M:
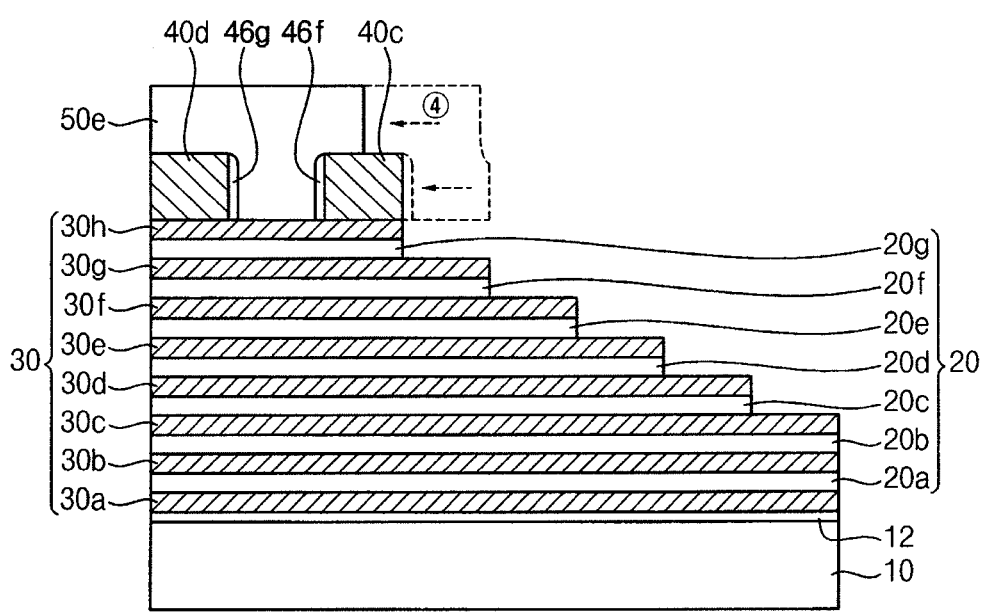
Figure 4N:
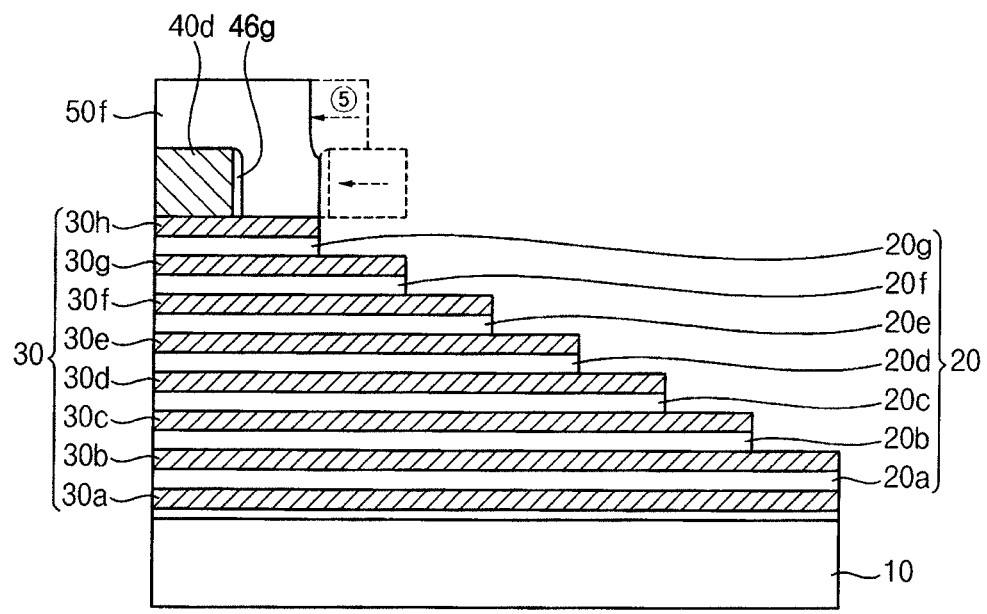
Figure 4O:
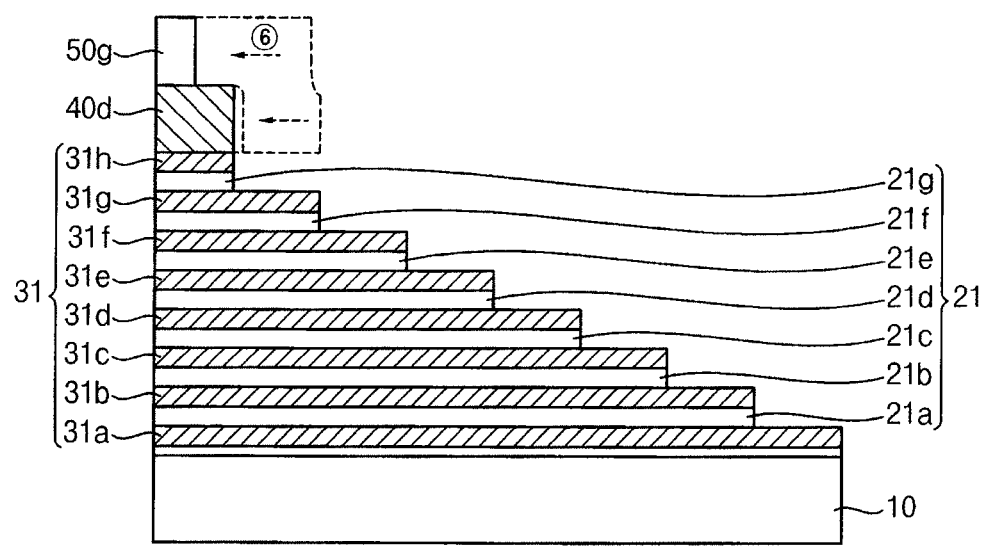

FIGS. 4A to 4O are cross-sectional views for explaining a method of manufacturing the connecting structure illustrated in FIGS. 1 & 2 in accordance with exemplary embodiments. FIGS. 4A to 4O are cross-sectional views of the connecting structure provided in a connecting region. FIGS. 4A to 4O are cross-sectional views cut along a line I-I' in FIG. 5A.

FIGS. 5A to 5F are plan views of an etching mask used for performing each etching step for forming a connecting structure in accordance with exemplary embodiments. FIG. 6 is a plan view for explaining a trimming process of a photoresist pattern.

Figure 5A:
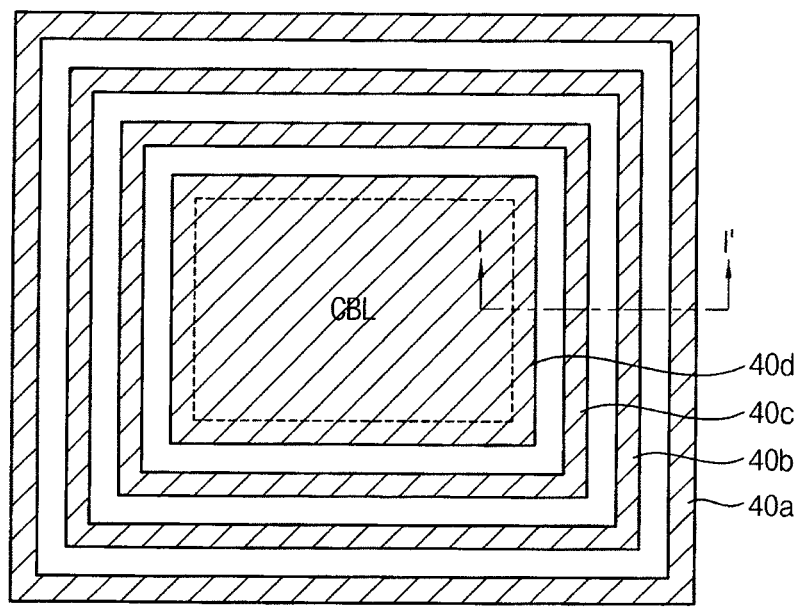
FIGS. 5A to 5F are plan views of an etching mask used for performing each etching step for forming a connecting structure in accordance with exemplary embodiments.
Figure 6:
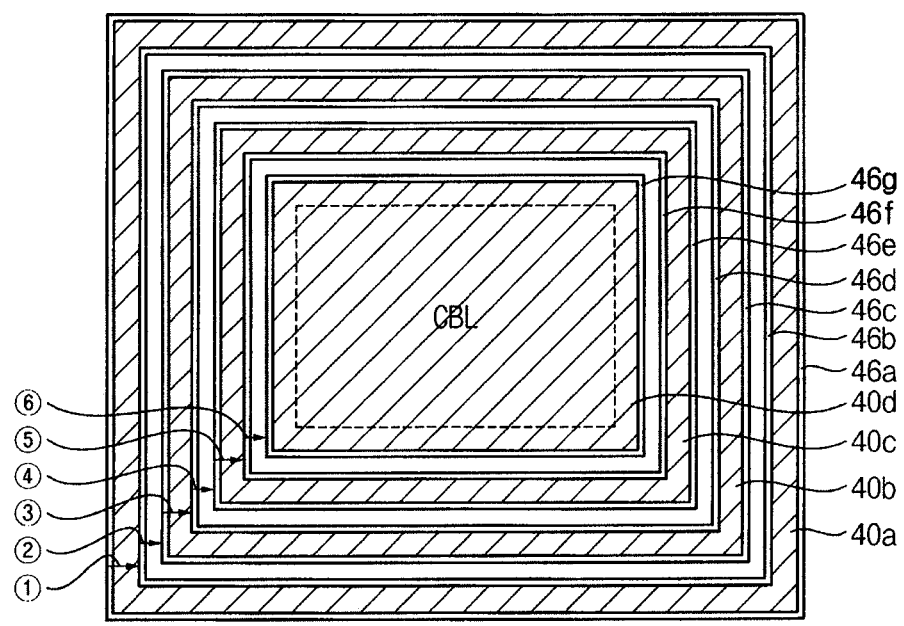

Referring to FIGS. 4A & 5A, a pad insulating layer 12 may be formed on a substrate 10 including a cell block region and a connecting region.

On the pad insulating layer 12, a sacrificial layer 30 including a first, second, third, fourth, fifth, sixth, seventh and eighth sacrificial layers 30a~30h and an insulating layer 20 including first, second, third, fourth, fifth, sixth and seventh insulating layers 20a~20g may be subsequently and repeatedly integrated. At the uppermost layer, the sacrificial layer may be formed. The insulating layer 20 may be formed by depositing silicon oxide. The sacrificial layer 30 may be formed using a material having an etching selectivity with respect to the insulating interlayer 20. Particularly, the sacrificial layer 30 may be formed using silicon nitride or polysilicon.

The first to eighth sacrificial layers 30a~30h may be formed to have the same height. In addition, the first to seventh insulating interlayers 20a~20g may be formed to have the same height. In exemplary embodiments, the sacrificial layer 30 may include eight layers and the insulating interlayer 20 may include seven layers. The first to eighth sacrificial layers 30a~30h may be formed on the substrate 10 and the first to seventh insulating interlayers 20a~20g may be formed between the first to eighth sacrificial layers 30a~30h.

On the uppermost eighth sacrificial layer 30h, a first mask layer (not illustrated) may be formed. The first mask layer may be formed by a spin coating process. The first mask layer may be formed using a material that may be patterned by photolithography. Particularly, the first mask layer may be formed as an amorphous carbon layer, a photoresist layer, etc. In a following process, a buffer layer may be formed on the surface portion of the first mask layer and so, the first mask layer may be preferably formed as the amorphous carbon layer having a hard property.

The first mask layer may be patterned by the photolithography to form an etching mask pattern 40 including first, second, third and fourth etching mask patterns 40a~40d. The etching mask pattern 40 may be formed in the connecting region. In exemplary embodiments, the etching mask pattern 40 may have a shape surrounding the cell block.

Each of the first to fourth etching mask patterns 40a, 40b, 40c and 40d may have a first width d1. Distance between the first to fourth etching mask patterns 40a, 40b, 40c and 40d may have a second width d2. The first width d1 and the second width d2 may be dependent from a third width d3 that may be defined as a width difference between an underlying sacrificial layer and an upper positioned sacrificial layer. Particularly, a sum of the first and second widths d1 and d2 may be twice of the third width d3 that may be defined as a width difference between an underlying sacrificial layer and an upper positioned sacrificial layer. The first width d1 may be smaller than the second width d2. The difference between the first width d1 and the second width d2 may be in a range from about 10 Å to about 300 Å.

The etching mask pattern 40 may be used as an etching mask for patterning an edge portion of the first to eighth sacrificial layers 30a~30h. Accordingly, the number of the patterns constituting the etching mask pattern 40 may vary depending on the number of the integrated layers of the sacrificial layer 30 to be patterned. Particularly, the number of the patterns constituting the etching mask pattern 40 may be more than half of the number of the integrated layers of the sacrificial layer 30. When the number of the patterns constituting the mask pattern 40 is N, 2×N integrated layers of the sacrificial layer 30 may be patterned.

In order to pattern eight sacrificial layers 30a~30h, four etching mask patterns 40a~40d may be formed as illustrated in FIG. 4A. Thus formed four etching mask patterns 40a~40d may be defined as the first, second, third and fourth mask patterns 40a, 40b, 40c and 40d one by one from an edge portion of the connecting region.

Hereinafter, processes of forming the etching mask pattern 40 may be explained in detail referring to particular numerical values. The designated numerical values including a width of the mask pattern and an interval between the mask patterns may be illustrated only for the explanation and may be changed without limitation.

The third width d3 defined as the width difference between the underlying sacrificial layer and the upper positioned sacrificial layer may be set to about 4,000 Å. That is, a width of an upper surface portion of an exposed portion of each layer of the sacrificial layer 30 to make a contact with a contact plug may be about 4,000 Å.

The first width d1 of the patterns constituting the etching mask pattern 40 for forming the underlying and the upper positioned sacrificial layers may have a width less than about 4,000 Å by a magnitude of x. The second width d2 between the patterns constituting the etching mask pattern 40 may have a width greater than about 4,000 Å by the magnitude of x. The magnitude of x may be in a range from about 5 Å to about 150 Å. The first width may be about 3,950 Å and the second width d2 may be about 4,050 Å.

Figure 5B:
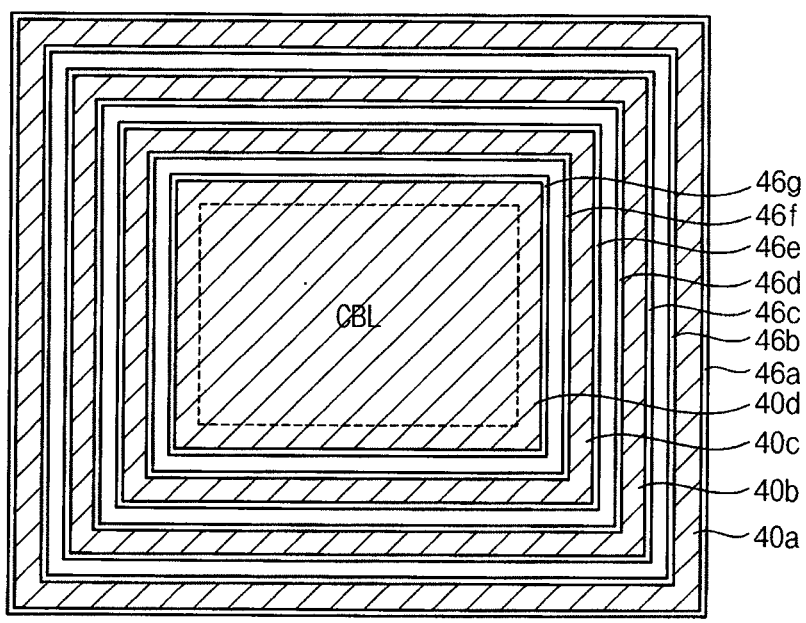

Referring to FIGS. 4B and 5B, a blocking layer 44 may be formed along the etching mask pattern 40 and an upper surface portion of the eighth sacrificial layer 30h. The blocking layer 44 may be formed using a material having an etching selectivity with respect to the etching mask pattern 40 and the sacrificial layer 30, respectively. In addition, the blocking layer 44 may be formed using a material having an etching selectivity with respect to a photoresist pattern to be formed in a following process. That is, the blocking layer 44 may be formed using a material that may be hardly removed while performing a process of removing the etching mask pattern 40. Further, the blocking layer 44 may be formed using a material that may be hardly removed while performing a process of removing the sacrificial layer 30. Particularly, the blocking layer 44 may be formed using silicon oxide.

A thickness of the blocking layer 44 may be half of a difference between the first width d1 and the second width d2. In this case, a gap between the patterns constituting the etching mask pattern 40 after forming the blocking layer 44 may be the same as the first width d1. Accordingly, the thickness of the blocking layer 44 may be in a range from about 5 Å to about 150 Å. When the first width d1 and the second width d2 are set to 3,950 Å and 4,050 Å as described above, the thickness of the blocking layer 44 may be about 50 Å. To form the blocking layer 44 having such a thin thickness, the blocking layer 44 may be formed by an atomic layer deposition method.

Referring to FIG. 4C, the blocking layer 44 may be anisotropically etched to form sidewall blocking patterns 46a~46g on either sidewalls of the first to fourth etching mask pattern elements 40a~40d of the etching mask pattern 40. Width of one etching mask pattern, e.g. the first etching mask pattern 40a and the sidewall blocking pattern 46a combined may be width of the sacrificial layer pattern exposed at a side portion of the connecting structure.

Between the first to seventh sidewall blocking patterns 46a~46g, the eighth sacrificial layer 30h may be exposed. The sidewall blocking patterns 46a~46g may be designated as the first, second, third, fourth, fifth, sixth and seventh sidewall blocking patterns 46a~46g one by one from the edge portion of the connecting region.

Figure 5C:
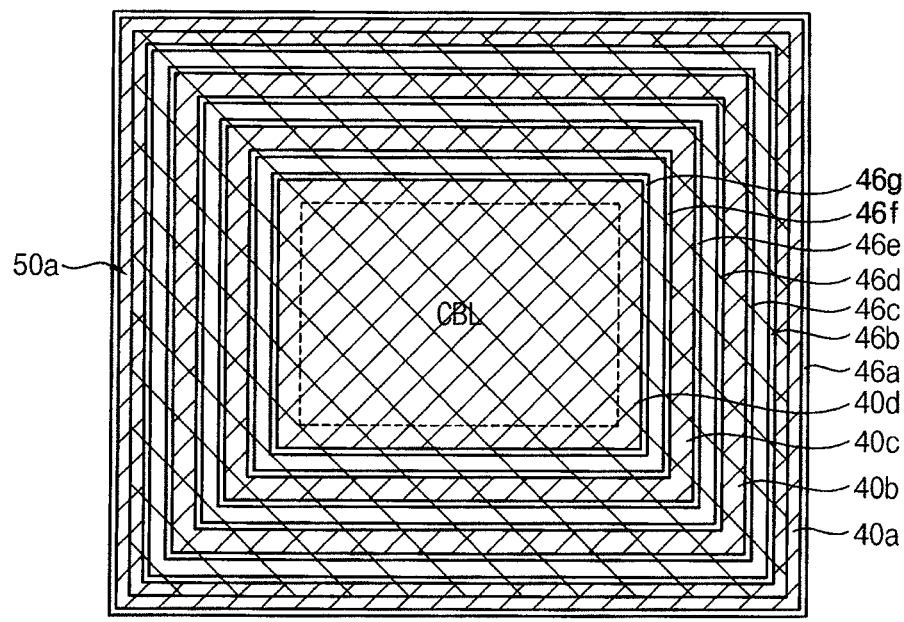

Referring to FIGS. 4D and 5C, a photoresist layer (not illustrated) covering the eighth sacrificial layer 30h, the first to fourth etching mask patterns 40a~40d and the first to seventh sidewall blocking patterns 46a~46g may be formed. The photoresist layer may be patterned by a photolithography to form a first photoresist pattern 50a exposing a portion of the first etching mask pattern 40a among the first to fourth etching mask patterns 40a~40d and the first sidewall blocking pattern 46a formed at one sidewall of the first etching mask pattern 40a. The first photoresist pattern 50a may cover a whole region of the cell block CBL and most of the connecting region. The first photoresist pattern 50a may expose the first sidewall blocking pattern 46a formed at an edge portion and at one sidewall of the first etching mask pattern 40a.

Referring to FIG. 4E, the exposed portion of the first sidewall blocking pattern 46a may be selectively removed. The eighth sacrificial layer 30h, the first etching mask pattern 40a and the first photoresist pattern 50a may not be removed while removing the first sidewall blocking pattern 46a. When the first sidewall blocking pattern 46a may be silicon oxide, the first sidewall blocking pattern 46a may be removed by a dry etching process using an etching gas including $SF_6$ as a main component.

Referring to FIG. 4F, the eighth sacrificial layer 30h may be etched using the first etching mask pattern 40a and the first photoresist pattern 50a as an etching mask. Then, the seventh insulating interlayer 20g may be etched using the seventh sacrificial layer 30g as an etch stopping layer. After completing the etching process, an edge portion of the eighth sacrificial layer 30h may be etched to form a staircase shape. In addition, the seventh sacrificial layer 30g may be exposed by the third width d3.

Referring to FIGS. 4G, 4H and 6, a portion of the first photoresist pattern 50a and the first etching mask pattern 40a may be etched. The first etching mask pattern 40a and the first photoresist pattern 50a may be etched by a dry etching process using oxygen or ozone as a main etching gas. Through the etching process, a sidewall portion of the first photoresist pattern 50a may undergo trimming to form a second photoresist pattern 50b.

The etching process may be stopped when the second sidewall blocking pattern 46b is exposed. Designated numeral ① may be an etch stopping point in FIG. 6. The etching may be performed until the second sidewall blocking pattern 46b may remain and so, a width of the exposed portion of the eighth sacrificial layer 30h may be constant. That is, an exposed upper surface portion of the eighth sacrificial layer 30h may be the same as a removed portion of the first etching mask pattern 40a.

Upper portions of the first photoresist pattern 50a and the first etching mask pattern 40a may be hardly etched while sidewall portions of the first photoresist pattern 50a and the first etching mask pattern 40a may be relatively rapidly etched. A polymer layer may be further formed on the upper surface portion of the first photoresist pattern 50a before etching the first photoresist pattern 50a and the first etching mask pattern 40a.

Referring to FIG. 4G, with a first polymer layer 55a, an etching of the upper portion of the first photoresist pattern 50a may be restrained while performing a following etching process and so, the sidewall portion of the first photoresist pattern 50a may be etched relatively rapidly. The first polymer layer 55a may also be etched while etching the first photoresist pattern 50a and the sidewall of the first etching mask pattern 40a to form a second polymer layer (not illustrated). Hereinafter, explanation may be proceeding in case of not including the polymer layer.

Referring to FIG. 4I, the second sidewall blocking pattern 46b may be removed to expose a sidewall of the second etching mask pattern 40b. On removing the second sidewall blocking pattern 46b, the eighth sacrificial layer 30h may be exposed by the third width d3. That is, edge portions of the eighth and seventh sacrificial layers 30h and 30g may have a staircase shape while exposing by the third width d3 for each sacrificial layer.

Figure 5D:
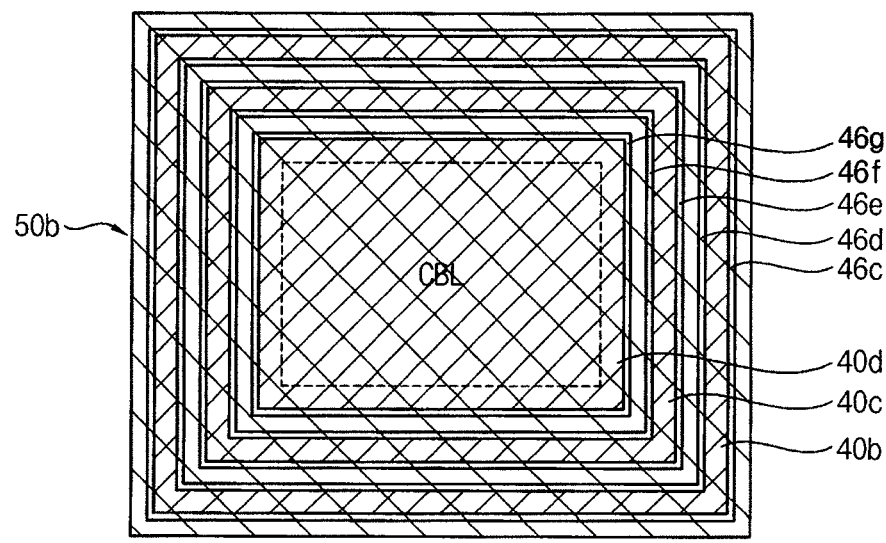

Referring to FIGS. 4J and 5D, the exposed portions of the eighth and seventh sacrificial layers 30h and 30g may be anisotropically etched using the second photoresist pattern 50b as an etching mask. After that, the seventh insulating interlayer 20g and the sixth insulating interlayer 20f underlying the eighth and seventh sacrificial layers 30h and 30g, respectively, may be anisotropically etched. Through performing the etching process, the edge portions of the eighth and seventh sacrificial layers 30h and 30g may be etched to form a staircase shape. In addition, the sixth and seventh sacrificial layers may be exposed by the preset third width d3.

Figure 5E:
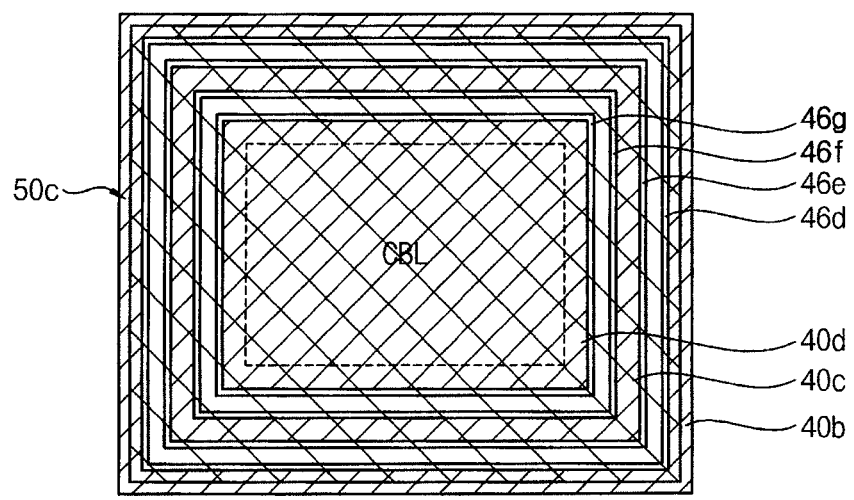

Referring to FIGS. 4K, 5E and 6, a portion of the second photoresist pattern 50b may be etched to expose the third sidewall blocking pattern 46c. Designated numeral ② may be an etch stopping point in FIG. 6 while performing the etching process.

Through the etching process, a sidewall of the second photoresist pattern 50b may undergo trimming to form a third photoresist pattern 50c. The third sidewall blocking pattern 46c may be removed to expose a sidewall of the second etching mask pattern 40b.

Exposed portions of the sixth to eighth sacrificial layers 30f~30h may be anisotropically etched using the second etching mask pattern 40b and the third photoresist pattern 50c as an etching mask. Then, the fifth to seventh insulating interlayers 20e~20g, respectively underlying the sixth to eighth sacrificial layers 30f~30h may be anisotropically etched. After completing the etching process, the fifth to seventh sacrificial layers 30e~30g may be exposed by the third width d3.

Referring to FIGS. 4L & 6, a portion of the third photoresist pattern 50c and the second etching mask pattern 40b may be etched to expose the fourth sidewall blocking pattern 46d. Designated numeral ③ may be an etch stopping point in FIG. 6 while performing the etching process.

A sidewall of the third photoresist pattern 50c may undergo trimming while performing the etching process to form a fourth photoresist pattern 50d. The fourth sidewall blocking pattern 46d may be removed.

Exposed portions of the fifth to eighth sacrificial layers 30e~30h may be anisotropically etched using the fourth photoresist pattern 50d as an etching mask. Then, the fourth to seventh insulating interlayers 20d~20g, respectively underlying the fifth to eighth sacrificial layers 30e~30h may be anisotropically etched. After completing the etching process, the fourth to seventh sacrificial layers 30d~30g may be exposed by the third width d3.

Referring to FIGS. 4M & 6, a portion of the fourth photoresist pattern 50d may be etched to expose the fifth sidewall blocking pattern 46e. Designated numeral ④ may be an etch stopping point in FIG. 6 while performing the etching process.

A sidewall of the fourth photoresist pattern 50d may undergo trimming while performing the etching process to form a fifth photoresist pattern 50e. The fifth sidewall blocking pattern 46e may be removed.

Exposed portions of the fourth to eighth sacrificial layers 30d~30h may be anisotropically etched using the fifth photoresist pattern 50e and the third etching mask pattern 40c as etching masks. Then, the third to seventh insulating interlayers 20c~20g, respectively underlying the fourth to eighth sacrificial layers 30d~30h may be anisotropically etched. After completing the etching process, the third to seventh sacrificial layers 30c~30g may be exposed by the third width d3.

Referring to FIGS. 4N & 6, a portion of the fifth photoresist pattern 50e and the third etching mask pattern 40c may be etched to expose the sixth sidewall blocking pattern 46f. Designated numeral ⑤ may be an etch stopping point in FIG. 6 while performing the etching process.

Through the etching process, a sixth photoresist pattern 50f may be formed. The sixth sidewall blocking pattern 46f may be removed.

Exposed portions of the third to eighth sacrificial layers 30c~30h may be anisotropically etched using the sixth photoresist pattern 50f as an etching mask. Then, the second to seventh insulating interlayers 20b~20g, respectively underlying the third to eighth sacrificial layers 30c~30h may be anisotropically etched. After completing the etching process, the second to seventh sacrificial layers 30b~30g may be exposed by the third width d3.

Figure 5F:
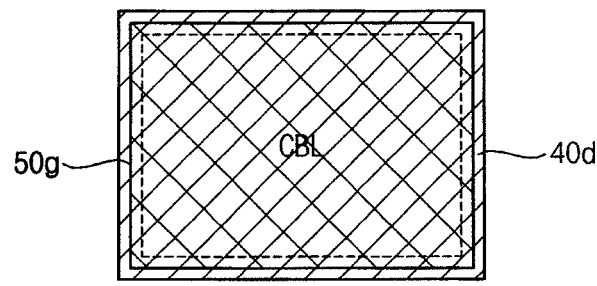

Referring to FIGS. 4O, 5F and 6, a portion of the sixth photoresist pattern 50f may be etched to expose the seventh sidewall blocking pattern 46g. Designated numeral ⑥ may be an etch stopping point in FIG. 6 while performing the etching process.

Through the etching process, a sidewall of the sixth photoresist pattern 50f may undergo trimming to form a seventh photoresist pattern 50g. The seventh sidewall blocking pattern 46g may be removed.

Exposed portions of the second to eighth sacrificial layers 30b~30h may be anisotropically etched using the seventh photoresist pattern 50g and the fourth etching mask pattern 40d as etching masks. Then, the first to seventh insulating interlayers 20a~20g, respectively underlying the second to eighth sacrificial layers 30b~30h may be anisotropically etched. After completing the etching process, the first to seventh sacrificial layers 30a~30g may be exposed by the third width d3.

Then, the seventh photoresist pattern 50g and the fourth etching mask pattern 40d may be removed.

Through performing the etching process, a connecting structure 55 including the first to eighth sacrificial layer patterns 31a~31h and having a staircase shaped edge portion may be completed. The exposed portions at the edge portions of the first to eighth sacrificial layer patterns 31a~31h may have a constant width of d3. The first to eighth sacrificial layer patterns 31a~31h may be formed by performing photolithography twice.

The exposed width d3 at the edge portions of the first to eighth sacrificial layer patterns 31a~31h may be the same as a sum of a width of one pattern among the etching mask patterns and a width of one of the sidewall blocking patterns. Accordingly, the exposed width of the first to eighth sacrificial layer patterns 31a~31h may have a small process variation similar to a dispersion degree of a line width of initially formed etching mask patterns. Particularly, the exposed width of the first to eighth sacrificial layer patterns 31a~31h may have an process variation less than about 100 Å with respect to a preset value.

FIGS. 7A to 7D are cross-sectional views for explaining a method of manufacturing a connecting structure illustrated in FIGS. 1 & 2 in accordance with another exemplary embodiments.

The same procedure may be performed as explained referring to FIGS. 4A to 4O except for using the sidewall blocking pattern as an etching mask while performing the etching process with respect to each sacrificial layer.

A structure illustrated in FIG. 4D may be formed through performing the same procedure explained referring to FIGS. 4A to 4D.

Figure 7A:
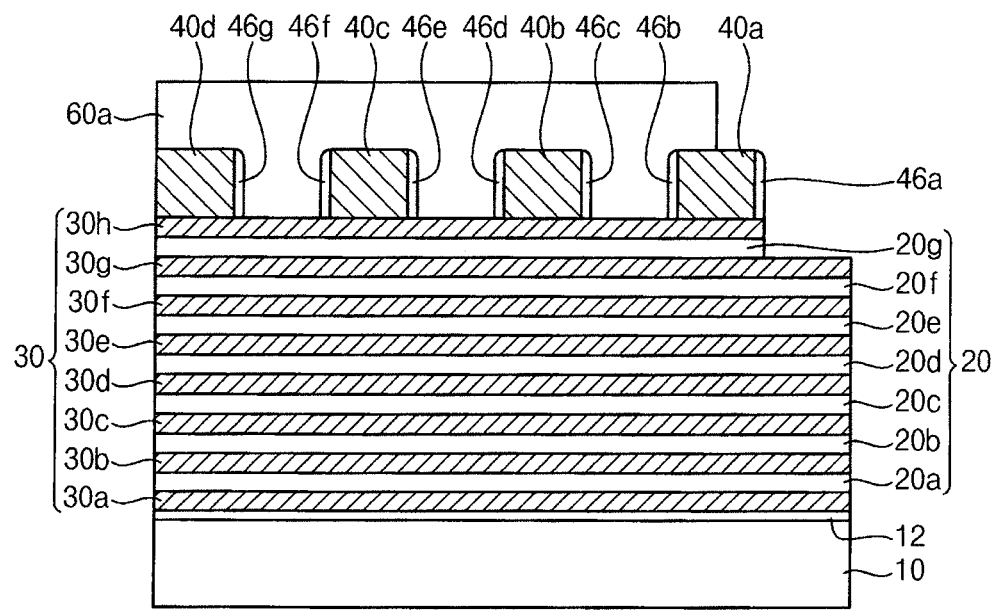
FIGS. 7A to 7D are cross-sectional views for explaining a method of manufacturing a connecting structure illustrated in FIGS. 1 & 2 in accordance with another exemplary embodiments.

Referring to FIG. 7A, the eighth sacrificial layer 30h may be etched using the first photoresist pattern 60a, the first etching mask pattern 40a and the first sidewall blocking pattern 46a as etching masks. Then, the seventh insulating interlayer 20g may be etched using the seventh sacrificial layer 30g as an etch stopping layer. After completing the etching process, an edge portion of the eighth sacrificial layer 30h may be etched to form a staircase shape. The seventh sacrificial layer 30g may be exposed by the selected third width. The third width may be a sum of a width of one etching mask pattern and a width of one sidewall blocking pattern.

Figure 7B:
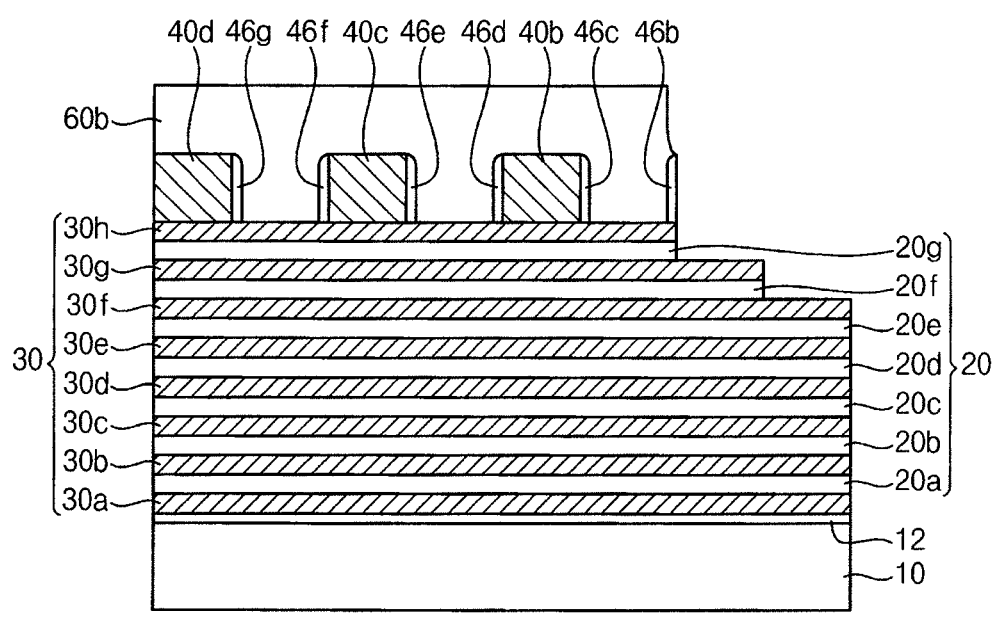

Referring to FIG. 7B, the first sidewall blocking pattern 46a may be removed. Then, a portion of the first photoresist pattern 60a and the first etching mask pattern 40a may be etched to expose the second sidewall blocking pattern 46b. Through the etching process, a sidewall of the first photoresist pattern 60a may undergo trimming to form the second photoresist pattern 60b.

On exposure of the second sidewall blocking pattern 46b, the etching may be stopped. Since the etching may be performed until the second sidewall blocking pattern 46b may be exposed, a width of an exposed portion of the eighth sacrificial layer 30h may be constant. That is, the exposed portion of the eighth sacrificial layer 30h may be the same as the removed portions of the first etching mask pattern 40a and the first sidewall blocking pattern 46a.

The exposed portions of the eighth sacrificial layer 30h and the seventh sacrificial layer 30g may be anisotropically etched using the second photoresist pattern 60b and the second sidewall blocking pattern 46b as etching masks. Then, the seventh and sixth insulating interlayers 20f and 20g, respectively underlying the eighth and seventh sacrificial layers 30h and 30g may be anisotropically etched. After completing the etching process, edge portions of the eighth and seventh sacrificial layers 30h and 30g may be etched to form a staircase shape and edge portions of the sixth and seventh sacrificial layers 30f and 30g may be exposed by the third width.

Figure 7C:
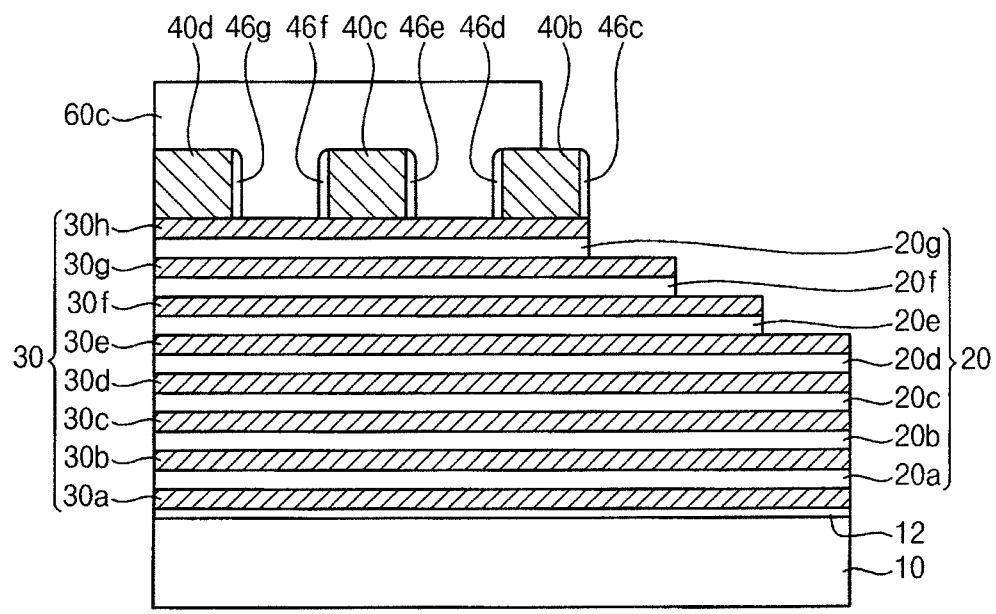
Figure 7D:
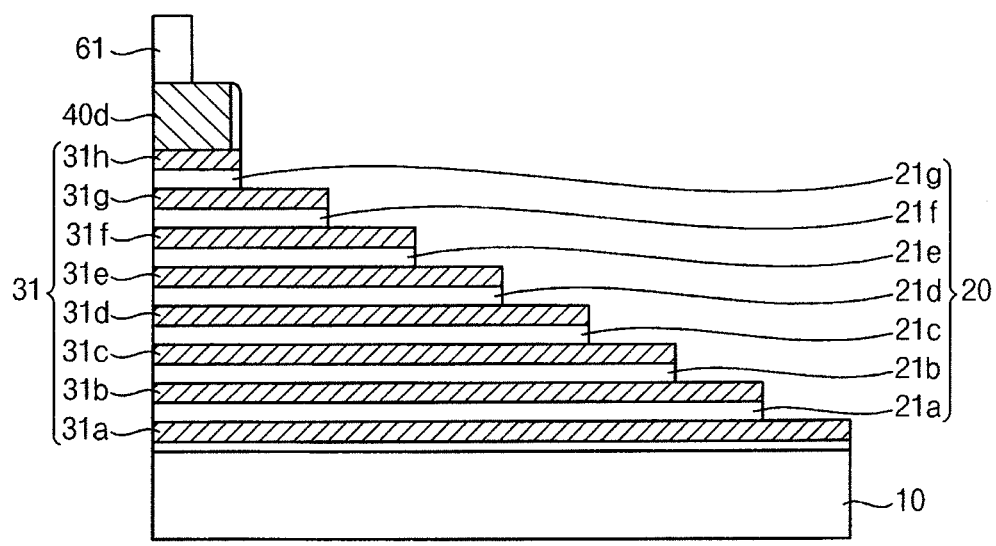

Referring to FIG. 7C, the second sidewall blocking pattern 46b may be removed. The second photoresist pattern 60b may be partially etched to expose the third sidewall blocking pattern 46c. Through performing the etching process, a sidewall of the second photoresist pattern 60b may undergo trimming to form the third photoresist pattern 60c.

The exposed portions of the sixth and seventh sacrificial layers 30f and 30g may be anisotropically etched using the third photoresist pattern 60c, the second sidewall blocking pattern 46b and the second etching mask pattern 40b as etching masks. Then, the fifth and sixth insulating interlayers 20e and 20f, respectively underlying the sixth and seventh sacrificial layers 30f and 30g may be anisotropically etched. Through performing the etching process, edge portions of the sixth to eighth sacrificial layers 30f~30h may be etched to form a staircase shape. Edge portions of the fifth to seventh sacrificial layers 30e~30g may be exposed by the third width.

Then, a portion of the photoresist pattern or the etching mask pattern may be removed to expose the sidewall blocking pattern and thus exposed portion of the sacrificial layer may be etched using the partially etched photoresist pattern and the exposed sidewall blocking pattern as etching masks. Processes explained referring to FIGS. 7A and 7B may be repeatedly performed.

After completing the above-described process, first, second, third, fourth, fifth, sixth, seventh and eighth sacrificial layer patterns 31a, 31b, 31c, 31d, 31e, 31f, 31g and 31h having a staircase shaped edge portion may be formed on the substrate 10. Upper edge portion of each layer of the sacrificial layer pattern 31 may be exposed by the third width.

Remaining photoresist pattern 61 and etching mask pattern 40d may be removed.

Hereinafter, a method of manufacturing a vertical type semiconductor device using the above-described method of forming the connecting structure may be explained. The semiconductor device in an exemplary embodiment may be a vertical NAND flash memory device. FIGS. 8A to 8F are cross-sectional views illustrating steps of manufacturing the vertical NAND flash memory device according to the inventive concept.

Referring to FIG. 8A, a plurality of sacrificial layers $102a\sim102h$ and a plurality of insulating interlayers $104a\sim104g$ are formed on a semiconductor substrate 100. The semiconductor substrate 100 includes a cell forming region CELL REGION and a connection region CONNECTING REGION in a cell array region CAR of FIG. 1. The cell forming region CELL REGION is a region where memory cells may be formed. The connection region CONNECTING REGION is a region where wirings are formed to provide electrical connections of the memory cells. The semiconductor substrate 100 may be a single crystalline substrate and a pad insulating layer (not illustrated) may be formed on the semiconductor substrate 100.

The sacrificial layers $102a\sim102h$ and the insulating interlayers $104a\sim104g$ may be alternately formed. For example, the number of the sacrificial layers $102a\sim102h$ is eight, and the number of the insulating interlayers $104a\sim104g$ is seven, for the each of insulating interlayers $104a\sim104g$ is interposed between two neighboring sacrificial layers. The sacrificial layers $102a\sim102h$ may have the same thickness each other. The insulating interlayers $104a\sim104g$ may have the same thickness each other. The sacrificial layers $102a\sim102h$ may be formed using a material having an etching selectivity with respect to the insulating interlayers $104a\sim404g$. For example, the sacrificial layers $102a\sim102h$ may be silicon nitride, and the insulating interlayers may be silicon oxide.

On the top sacrificial layer $102h$, an insulating interlayer 106 and a polish stopping layer 108 may be formed for independently processing the cell forming region CELL REGION and the connection region CONNECTING REGION. The insulating interlayer 106 may cover the top sacrificial layer $102h$ and have a greater thickness that the insulating interlayers $104a\sim104g$. The polish stopping layer 108 may be formed using a material having a polishing selectivity with respect to silicon oxide. For example, the polish stopping layer 108 may be formed using polysilicon or silicon nitride.

Figure 8B:
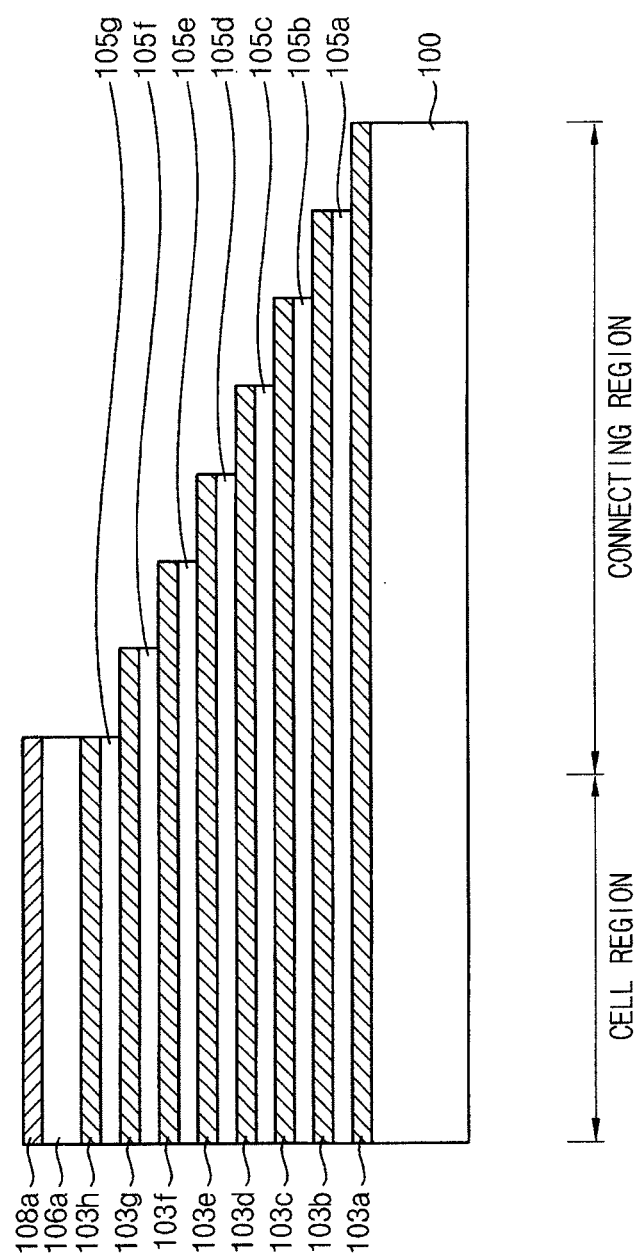

Referring to FIG. 8B, the polish stopping layer 108 is patterned to cover the cell forming region CELL REGION and a staircase shaped step is formed in the connection region CONNECTING REGION. The alternate layers $102a\sim102h$ and $104a\sim104g$ which are not covered by the patterned polish stopping layer $108a$ may be patterned to form the staircase shaped step. The staircase shaped step may be formed in accordance with the process described referring to FIGS. 4A to 4O. Alternatively, the staircase shaped step may be formed in accordance with the process described referring to FIGS. 7A to 7D.

After completing the above-described processes using two photolithography process steps, the staircase shaped step may be formed in the connection region CONNECTING REGION. The each layer of the sacrificial layers $103a\sim103h$ may provide a step having a substantially same width, having a process variation less than about 100 Å from a targeted width value. The first photolithography process is used for patterning the polish stopping layer 108, and the second photolithography process is used in the processes described in FIG. 4A to 4O or in FIG. 7A to 7D to form the staircase shaped step.

FIG. 8C shows a planarized insulating layer 128 from an insulating layer covering a resultant structure of FIG. 8B. For example, the insulating layer 128 may cover the stopping layer pattern $108a$ and the staircase shaped step having patterned sacrificial layers $103a\sim103h$ and insulation interlayers $105a\sim105g$. The insulating layer may be formed using silicon oxide. The insulating layer may be planarized to the extent that an upper surface portion of the stopping layer pattern $108a$ may be exposed.

FIG. 8C further shows channel holes 120 formed in the cell forming region CELL REGION. In order to form the channel holes 120, an etching mask pattern (not illustrated) for defining the channel holes 120 may be formed on the stopping layer pattern $108a$. Using the etching mask pattern, the insulating interlayers $105a\sim105g$, $106a$ and the first to eighth sacrificial layer patterns $103a\sim103h$ may be subsequently etched using the etching mask pattern as an etching mask to form a plurality of channel holes 120. The channel holes 120 may arrange in a row.

A first semiconductor material layer (not illustrated) may be formed along a sidewall of the channel holes 120, a bottom portion of the substrate 100, the stopping layer pattern $108a$ and the ninth insulating interlayer 128. The first semiconductor material layer may be a polysilicon layer. A silicon oxide layer (not illustrated) may be formed on the first semiconductor material layer so as to completely fill up the inner portion of the channel hole 120.

The silicon oxide layer may be partially etched to form a silicon oxide layer pattern 124 to the extent that the inner portion of the channel hole 120 may be filled up with silicon oxide. An upper surface portion of the silicon oxide layer pattern 124 may be positioned higher than the eighth sacrificial layer pattern $103h$.

A second semiconductor material layer (not illustrated) filling up the inner portion of the channel hole 120 may be formed on the silicon oxide layer pattern 124. The second semiconductor material layer may be formed using the same material as the first semiconductor material layer. The second semiconductor material layer may be polished to expose an upper surface portion of the stopping layer pattern $108a$. A channel layer pattern 122 having a macaroni shape and a second semiconductor pattern 126 may be formed in the channel hole 120.

Figure 8D:
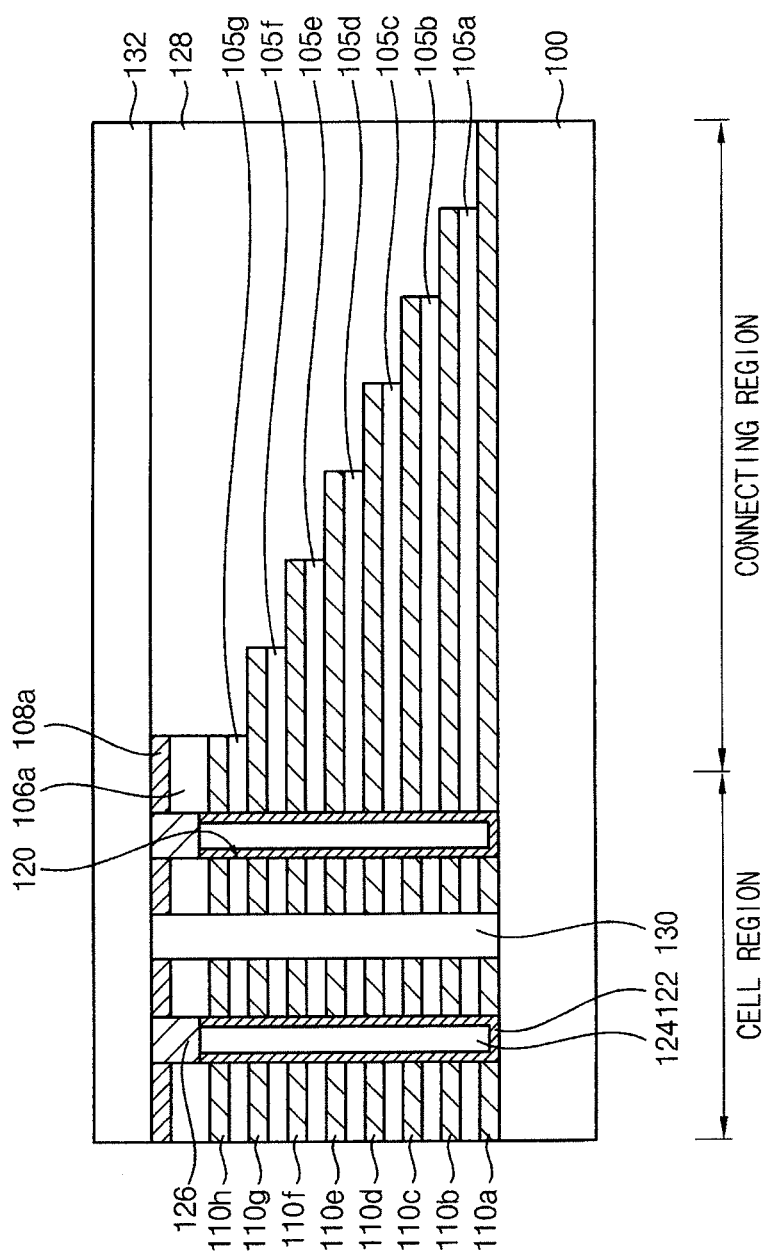

Referring to FIG. 8D, the stopping layer pattern $108a$ and the connecting structure between the channel layer patterns 122 may be etched to form an opening portion (not illustrated). The opening portion may have a trench shape extending in one direction. In addition, a surface portion of the substrate 100 may be exposed through a bottom portion of the opening portion.

After forming the opening portion, the first to eighth sacrificial layer patterns $103a\sim103h$ exposed to a sidewall of the opening portion may be removed to form grooves.

A tunnel insulating layer (not illustrated), a charge trapping layer (not illustrated) and a blocking dielectric layer (not illustrated) may be formed along the grooves and an inner surface portion of the opening portion. On the blocking dielectric layer, a conductive layer (not illustrated) completely filling up the inner portions of the grooves and the opening portion may be formed. The conductive layer may be formed by depositing a conductive material having a good step coverage characteristic to restrain a generation of voids. The conductive material may include a metal. Particularly, the conductive material may include a material having a low electric resistance such as tungsten, tungsten nitride, titanium, titanium nitride, tantalum, tantalum nitride, platinum, etc. The conductive layer may be formed by forming a barrier metal layer including titanium, titanium nitride, tantalum, tantalum nitride, etc. and then a metal layer including tungsten.

Then, the conductive layer formed in the inner portion of the opening portion may be removed. The removal may be performed through a wet etching process. The conductive layer formed in the inner portion of the grooves may remain to form first, second, third, fourth, fifth, sixth, seventh and eighth control gate electrodes 110*a*, 110*b*, 110*c*, 110*d*, 110*e*, 110*f*, 110*g* and 110*h*. The first to eighth control gate electrodes 110*a*~110*h* may be called as the first to eighth control gate electrodes from the substrate 100.

The first to eighth control gate electrodes 110*a*~110*h* positioned in the connecting region may have a staircase shaped side edge portion. Accordingly, the exposed portion of the side edge portion may be used as a pad for connecting a word line. Since the width of each exposed portion at the edge portion of the connecting structure may be constant, the width of the pad portion of the first to eighth control gate electrodes 110*a*~110*h* may be uniform.

Into the substrate 100 at the bottom portion of the opening portion between the first to eighth control gate electrodes 110*a*~110*h*, n-type impurities may be doped to form an impurity doped region (not illustrated) used as a source line (S/L).

An insulating layer filling up the opening portion may be formed and a polishing process may be performed to planarize the insulating layer and to from an insulating layer pattern 130. A tenth insulating layer 132 covering the structure including the channel layer pattern 122 and the first to eighth control gate electrodes 110*a*~110*h* may be formed.

Referring to FIG. 8E, a bit line contact 142 may be formed to electrically contact with an upper surface portion of the second semiconductor pattern 126 through the tenth insulating interlayer 132. Contact plugs 140*a*~140*h* contact with the pad portions of the first to eighth control gate electrodes 110*a*~110*h* through the tenth insulating interlayer 132. Since control gate electrodes 110*a*~110*h* may have pad portions having uniform width or steps having uniform width, contact defects due to mis-alignment of pad portions, generated by a deviation of control gate electrodes 110*a*~110*h*, may be rarely generated while forming the first to eighth contact plugs 140*a*~140*h*.

Contact plugs 140*a*~140*h* and wiring lines 144 may be formed to electrically contact with the steps having uniform width of the control gate electrode 110*a*~110*h*.

Figure 8F:
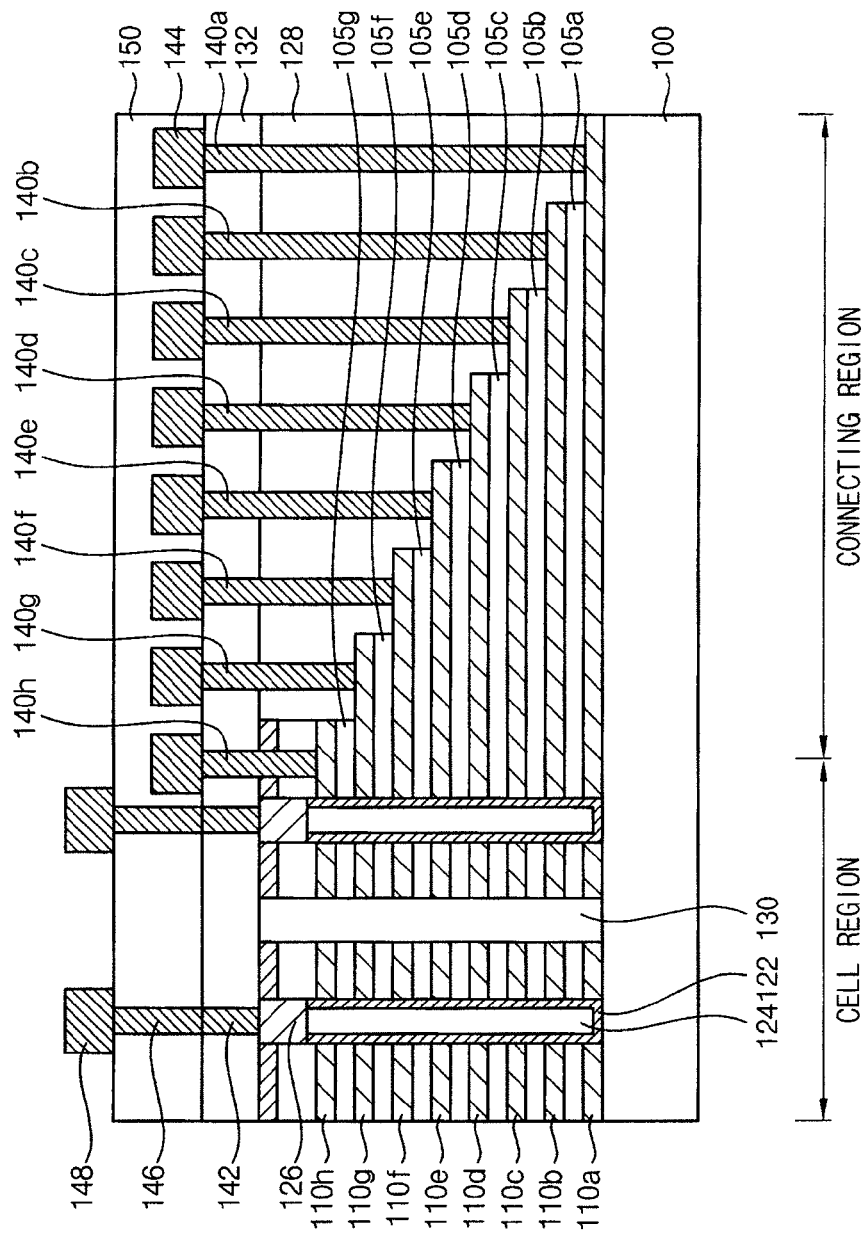

Referring to FIG. 8F, an eleventh insulating interlayer 150 covering the bit line contact 142 and the wiring lines 144 may be formed. Through the eleventh insulating interlayer 150, a contact plug 146 making a contact with an upper surface portion of the bit line contact 142 and a bit line 148 may be formed. The bit line 148 may have a line shape and may make an electric connection with the channel layer pattern 122.

Through the above-described processes, the pad portion of the first to eighth control gate electrodes 110*a*~110*h* may have a uniform width and may be formed at a desired position. In addition, since the connecting structure may be formed by applying twice of photolithography, the first to eighth control gate electrodes 110*a*~110*h* may be formed with a low cost.

The vertical type memory device may be manufactured with a low cost in exemplary embodiments.

Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of manufacturing a semiconductor device comprising steps of:
    forming a plurality of memory cells on a memory cell region in a substrate;
    alternately forming a sacrificial layer and an insulating interlayer on a connection region for providing a plurality of wirings configured to electrically connect the plurality of memory cells;
    forming an etching mask pattern including a plurality of etching mask pattern elements on a top sacrificial layer;
    forming blocking sidewalls on either sidewalls of each of the etching mask pattern elements;
    forming a first photoresist pattern selectively exposing a first blocking sidewall furthermost from the memory cell region and covering the other blocking sidewalls, the first photoresist pattern exposing a predetermined portion of the top sacrificial layer;
    etching the exposed top sacrificial layer and an insulating interlayer below the exposed top sacrificial layer to expose a second sacrificial layer;
    forming a second photoresist pattern by laterally removing the first photoresist pattern to the extent that a second blocking sidewall is exposed, the second photoresist exposing the predetermined portion of the top sacrificial layer; and
    etching the exposed top and second sacrificial layers and the insulating interlayers below the respective top and second sacrificial layers using the second photoresist pattern to form a staircase shaped side edge portion.

2. The method of claim 1, wherein the etching mask pattern is formed using amorphous carbon or photoresist.

3. The method of claim 1, wherein the etching mask pattern elements have a first width, and a gap between adjacent etching mask pattern elements having blocking sidewall has substantially the same width with the first width.

4. The method of claim 1, wherein width of the etching mask pattern and the sidewall blocking pattern combined is substantially the same with width of an exposed portion of the sacrificial layer pattern at the side edge portion of the connection region.

5. The method of claim 1, wherein a number of the etching mask pattern elements is greater than a number of sacrificial layers formed by the step of alternately forming a sacrificial layer and an insulation interlayer.

6. The method of claim 1, further comprising steps of: removing the first exposed blocking sidewall before the step of etching the exposed top sacrificial layer; and removing the second exposed blocking sidewall before the step of etching the exposed top and second sacrificial layers.

7. The method of claim 1, further comprising a step of forming a polymer layer on an upper surface portion of the first photoresist pattern before the step of forming a second photoresist pattern.

8. The method of claim 1, wherein the blocking sidewalls are formed using a material having an etching selectivity with respect to the sacrificial layer, the etching mask pattern and the first photoresist pattern, respectively.

9. A method of manufacturing a semiconductor device comprising steps of:
    forming N sacrificial layers on a memory cell region and a connection region in a substrate;

forming N−1 insulation interlayers between the N sacrificial layers;

forming an etching mask pattern including N/2 etching mask pattern elements over the connection region;

forming sidewall blocking on either sidewalls of the etching mask pattern elements;

forming a photoresist layer over the etching mask pattern elements;

trimming the photoresist over the connection region to expose a furthermost sidewall blocking from the memory cell region and a predetermined portion of a top sacrificial layer;

etching the exposed top sacrificial layer and a top insulating layer to expose a second sacrificial layer underlying the top insulating layer; and repeating the steps of trimming and etching the exposed top sacrificial layer until a bottom sacrificial layer is exposed to form a staircase shaped edge portion in the connection region.

10. The method of claim 9, further comprising steps of:
forming an insulating layer after the step of repeating; and
forming N contact plugs through the insulating layer over the connection region to expose the sacrificial layers of the staircase shaped edge portion.

11. The method of claim 9, wherein the sacrificial layer is formed using silicon nitride and the insulating interlayer is formed using silicon oxide.

12. The method of claim 9, further comprising steps of:
forming a plurality of channel holes through the sacrificial and insulating layers over the cell formation region, the channel holes exposing the substrate; and
forming a channel layer in the channel holes.

13. The method of claim 12, further comprising a step of forming a bit line structure making an electric contact with an upper surface portion of the channel layer pattern.

14. The method of claim 12, wherein the channel layer includes a tunnel insulating layer, a charge storing layer and a blocking dielectric layer on an inner surface portion of the channel holes.

15. The method of claim 9, further comprising a step of removing the outermost sidewall blocking before the step of etching the exposed top sacrificial layer.

16. The method of claim 9, wherein the staircase shaped edge portion includes the bottom sacrificial layer and N−1 steps on the bottom sacrificial layer, each step having uniform width and height.

* * * * *